US012461287B2

(12) United States Patent
Takagi

(10) Patent No.: US 12,461,287 B2
(45) Date of Patent: Nov. 4, 2025

(54) LIGHT EMITTING DEVICE AND ELECTRONIC DEVICE FOR DIRECTION ADJUSTMENT OF EMANATING LIGHT

(71) Applicant: SONY GROUP CORPORATION, Tokyo (JP)

(72) Inventor: Akitsuna Takagi, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 501 days.

(21) Appl. No.: 17/802,229

(22) PCT Filed: Jan. 25, 2021

(86) PCT No.: PCT/JP2021/002358
§ 371 (c)(1),
(2) Date: Aug. 25, 2022

(87) PCT Pub. No.: WO2021/176882
PCT Pub. Date: Sep. 10, 2021

(65) Prior Publication Data
US 2023/0086115 A1 Mar. 23, 2023

(30) Foreign Application Priority Data
Mar. 3, 2020 (JP) .................. 2020-035473

(51) Int. Cl.
*G02B 5/20* (2006.01)
*G02B 1/14* (2015.01)
(Continued)

(52) U.S. Cl.
CPC .............. *G02B 5/201* (2013.01); *G02B 1/14* (2015.01); *G02B 3/0037* (2013.01);
(Continued)

(58) Field of Classification Search
None
See application file for complete search history.

(56) References Cited

U.S. PATENT DOCUMENTS

2010/0013741 A1\* 1/2010 Watanabe .............. H10K 59/38
345/32
2011/0057210 A1 3/2011 Sonoda
(Continued)

FOREIGN PATENT DOCUMENTS

JP 2009-049135 A 3/2009
JP 2011-112828 A 6/2011
(Continued)

OTHER PUBLICATIONS

International Search Report and Written Opinion of PCT Application No. PCT/JP2021/002358, issued on Mar. 30, 2021, 16 pages of ISRWO.

*Primary Examiner* — Nduka E Ojeh
(74) *Attorney, Agent, or Firm* — CHIP LAW GROUP

(57) ABSTRACT

A light emitting device includes a light emitting region constituted by light emitting elements arranged in a matrix, in which optical elements are included as optical elements formed in such a way as to correspond to the light emitting elements and configured to adjust a direction of emanating light, the optical elements being formed in such a way that one of a color filter layer and a transparent layer is formed to constitute a lower layer portion on an incident side and another is formed to constitute an upper layer portion on an emanating side, and the upper layer portion and at least a part of the lower layer portion are formed to be exposed to an interface with an outside.

14 Claims, 29 Drawing Sheets

(51) Int. Cl.
  *G02B 3/00*   (2006.01)
  *H10K 50/852* (2023.01)
  *H10K 50/858* (2023.01)
  *H10K 50/86*  (2023.01)
  *H10K 59/38*  (2023.01)
  *H10K 59/80*  (2023.01)
  *H10K 71/00*  (2023.01)

(52) U.S. Cl.
  CPC ......... *H10K 50/852* (2023.02); *H10K 50/858* (2023.02); *H10K 50/865* (2023.02); *H10K 59/38* (2023.02); *H10K 59/879* (2023.02); *H10K 71/00* (2023.02); *H10K 59/876* (2023.02)

(56) References Cited

U.S. PATENT DOCUMENTS

| | | | |
|---|---|---|---|
| 2015/0084026 A1 | 3/2015 | Miyamoto | |
| 2016/0218325 A1* | 7/2016 | Choi | H10K 59/873 |
| 2017/0183565 A1* | 6/2017 | Jun | C09K 11/025 |
| 2020/0357854 A1* | 11/2020 | Koshihara | H10K 59/38 |
| 2020/0358035 A1* | 11/2020 | Yokoyama | H10K 59/353 |

FOREIGN PATENT DOCUMENTS

| | | |
|---|---|---|
| JP | 2013-058447 A | 3/2013 |
| JP | 2013-149536 A | 8/2013 |
| JP | 2015-069700 A | 4/2015 |
| JP | 2016-045292 A | 4/2016 |
| JP | 2017-009625 A | 1/2017 |
| JP | 2018-092873 A | 6/2018 |
| JP | 2019088857 | 5/2019 |
| JP | 2019088858 | 5/2019 |
| JP | 2019088861 | 5/2019 |
| JP | 2020-184477 A | 11/2020 |
| JP | 2020-184478 A | 11/2020 |
| JP | 2020-184481 A | 11/2020 |
| KR | 20160137738 A | 12/2016 |

\* cited by examiner

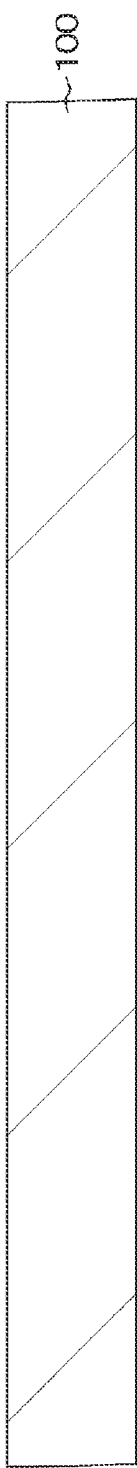
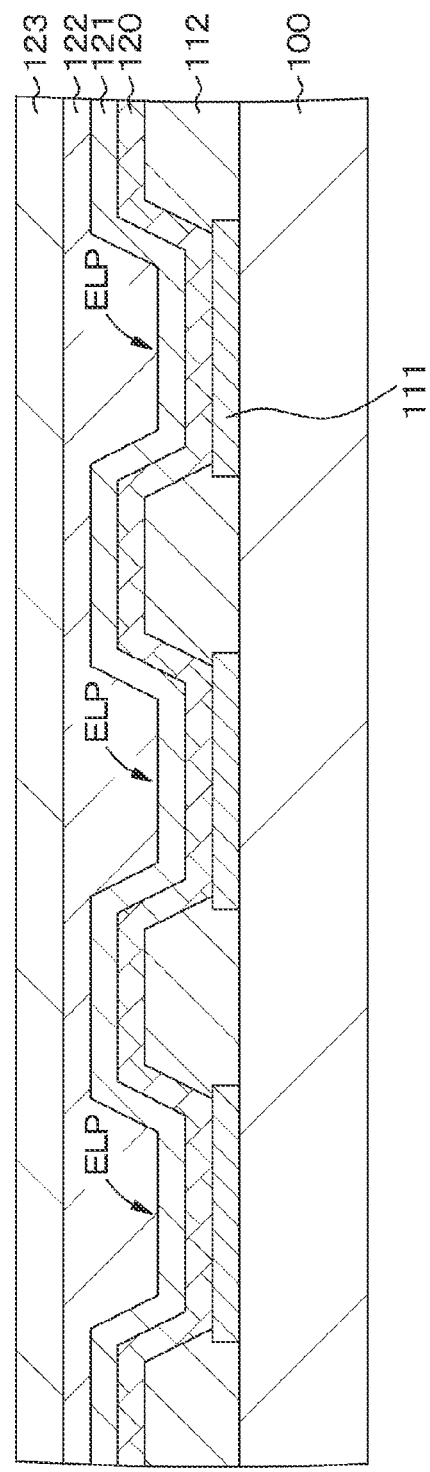

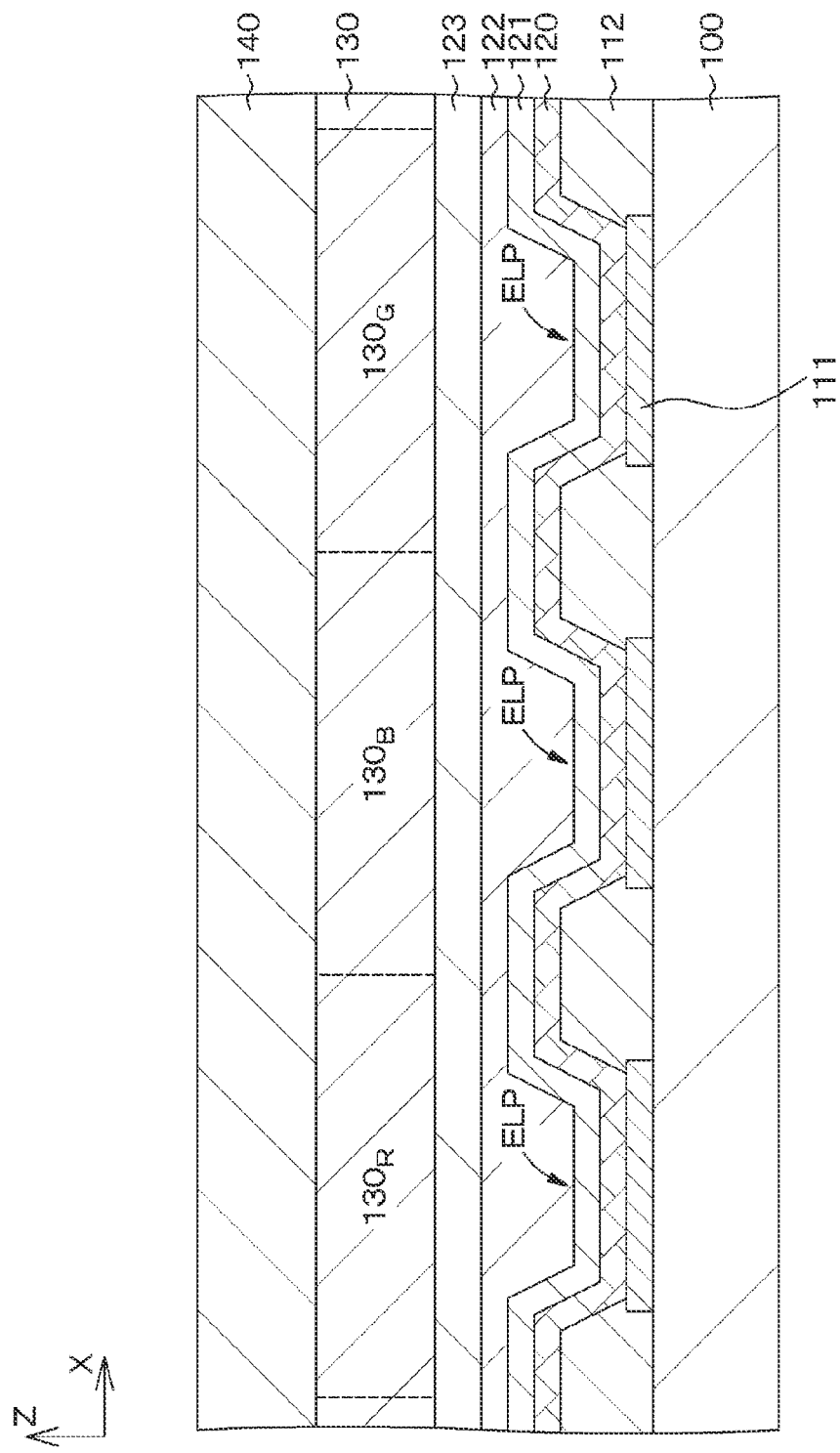

LIGHT EMITTING DEVICE AND ELECTRONIC DEVICE FOR DIRECTION ADJUSTMENT OF EMANATING LIGHT

CROSS REFERENCE TO RELATED APPLICATIONS

This application is a U.S. National Phase of International Patent Application No. PCT/JP2021/002358 filed on Jan. 25, 2021, which claims priority benefit of Japanese Patent Application No. JP 2020-035473 filed in the Japan Patent Office on Mar. 3, 2020. Each of the above-referenced applications is hereby incorporated herein by reference in its entirety.

TECHNICAL FIELD

The present disclosure relates to a light emitting device and an electronic device.

BACKGROUND ART

A light emitting element of a current drive type and a light emitting device including such a light emitting element are well known. For example, a light emitting element constituted by an organic electroluminescence element has attracted attention as a light emitting element capable of high intensity light emission by low-voltage direct current drive.

A light emitting device including a light emitting region constituted by light emitting elements arranged in a matrix is used for, for example, a purpose of emitting visible light to display an image, or a purpose of emitting infrared light in a predetermined pattern for distance measurement. In a light emitting device that is mounted on eyewear such as glasses or goggles and displays an image, an increase in brightness is required in addition to adopting light emitting elements in a size of about several micrometers to 10 micrometers. For example, Patent Document 1 proposes improving light extraction efficiency by forming a microlens array constituted by a color filter on a light emitting region.

CITATION LIST

Patent Document

Patent Document 1: Japanese Patent Application Laid-Open No. 2013-149536

SUMMARY OF THE INVENTION

Problems to be Solved by the Invention

In a microlens constituted by a color filter, there remains a challenge of achieving a suitable balance between a characteristic related to adjustment of the direction of emanating light such as light collection and divergence and a characteristic related to efficient extraction of light of a predetermined wavelength. That is, it is necessary to increase the thickness of the color filter to some extent in order to secure a lens power, but this decreases the efficiency of extracting light of a predetermined wavelength.

It is therefore an object of the present disclosure to provide a light emitting device capable of achieving a suitable balance between the characteristic related to adjustment of the direction of emanating light and the characteristic related to efficient extraction of light of a predetermined wavelength, and an electronic device including such a light emitting device.

Solutions to Problems

In order to achieve the object described above, a light emitting device according to the present disclosure includes:
  a light emitting region constituted by light emitting elements arranged in a matrix,
  in which optical elements are included as optical elements formed in such a way as to correspond to the light emitting elements and configured to adjust a direction of emanating light, the optical elements being formed in such a way that one of a color filter layer and a transparent layer is formed to constitute a lower layer portion on an incident side and another is formed to constitute an upper layer portion on an emanating side, and the upper layer portion and at least a part of the lower layer portion are formed to be exposed to an interface with an outside.

In order to achieve the object described above, an electronic device according to the present disclosure includes a light emitting device including:
  a light emitting region constituted by light emitting elements arranged in a matrix,
  in which optical elements are included as optical elements formed in such a way as to correspond to the light emitting elements and configured to adjust a direction of emanating light, the optical elements being formed in such a way that one of a color filter layer and a transparent layer is formed to constitute a lower layer portion on an incident side and another is formed to constitute an upper layer portion on an emanating side, and the upper layer portion and at least a part of the lower layer portion are formed to be exposed to an interface with an outside.

BRIEF DESCRIPTION OF DRAWINGS

FIGS. 6A and 6B are schematic partial cross-sectional views of a substrate and the like for illustrating a method of manufacturing the light emitting device according to the first embodiment.

FIG. 7 is a schematic partial cross-sectional view of a substrate and the like for illustrating the method of manufacturing the light emitting device according to the first embodiment, following FIG. 6B.

FIGS. 27A and 27B are external views of a single-lens reflex digital still camera with interchangeable lenses, in which FIG. 27A illustrates a front view thereof and FIG. 27B illustrates a rear view thereof.

MODE FOR CARRYING OUT THE INVENTION

Figure 1:
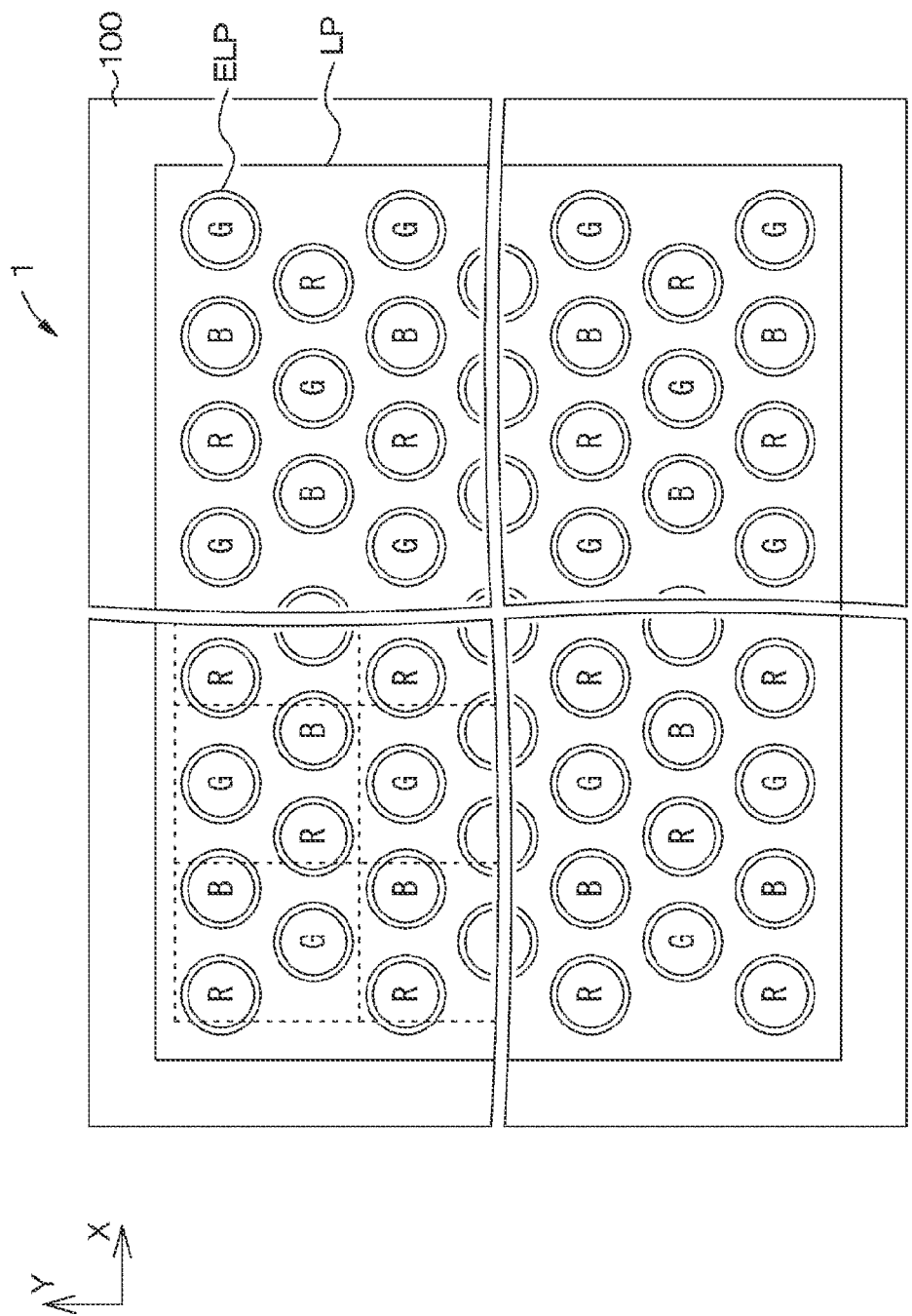
FIG. 1 is a schematic plan view for illustrating a light emitting device according to a first embodiment.

The present disclosure will be described below with reference to the drawings on the basis of embodiments. The present disclosure is not limited to the embodiments, and the various numerical values and materials in the embodiments are examples. In the following description, the same elements or elements having the same functions will be denoted by the same reference characters, without redundant description. Note that the description will be given in the order below.

1. General description related to light emitting device and electronic device according to present disclosure
2. First embodiment and various modifications
3. Second Embodiment
4. Third Embodiment
5. Fourth Embodiment
6. Description of electronic device
7. Others

[General Description Related to Light Emitting Device and Electronic Device According to Present Disclosure]

As described above, a light emitting device according to the present disclosure and a light emitting device used in an electronic device according to the present disclosure (hereinafter, these may be simply referred to as a "light emitting device of the present disclosure") include:

a light emitting region constituted by light emitting elements arranged in a matrix, in which optical elements are included as optical elements formed in such a way as to correspond to the light emitting elements and configured to adjust a direction of emanating light, the optical elements being formed in such a way that one of a color filter layer and a transparent layer is formed to constitute a lower layer portion on an incident side and another is formed to constitute an upper layer portion on an emanating side, and the upper layer portion and at least a part of the lower layer portion are formed to be exposed to an interface with an outside.

The light emitting device of the present disclosure may include the optical elements in which the color filter layer is formed to constitute the lower layer portion on the incident side and the transparent layer is formed to constitute the upper layer portion on the emanating side. In this case, a configuration may be adopted in which color filter layers of different types are formed in such a way as to be laminated in a region between each of the optical elements adjacent to each other.

Alternatively, the light emitting device of the present disclosure may include the optical elements in which the transparent layer is formed to constitute the lower layer portion on the incident side and the color filter layer is formed to constitute the upper layer portion on the emanating side.

The light emitting device of the present disclosure including the above-described various preferable configurations may have a configuration in which the optical elements have a planar or curved interface between the upper layer portion and the lower layer portion.

The light emitting device of the present disclosure including the above-described various preferable configurations may further include an optical element entirely formed by a color filter layer or a transparent layer. For example, it is also possible to adopt a configuration in which an optical element entirely formed by a transparent layer is disposed for a light emitting element that performs white display, or a configuration in which optical elements having a configuration in which a color filter layer and a transparent layer are laminated are disposed for a light emitting element that performs red display and a light emitting element that performs blue display, and an optical element entirely formed by a green color filter layer is disposed for a light emitting element that performs green display.

In the light emitting device of the present disclosure including the above-described various preferable configurations, the color filter layer may include fine particles constituting a coloring material and/or quantum dots. The color filter layer may be constituted with the use of a known resist material to which a desired coloring material or the like is added. As the coloring material, well-known pigments and dyes can be used. Furthermore, the fine particles constituting the quantum dots are not particularly limited, and, for example, light-emitting semiconductor nanoparticles can be used. The color filter layer including the coloring material displays color by allowing for transmission of light in a target wavelength range among light from the light emitting element. Furthermore, the color filter layer including the fine particles constituting the quantum dots displays color by converting the wavelength of light from the light emitting element.

The light emitting device of the present disclosure including the above-described various preferable configurations may have a configuration in which a transparent protective film is formed on an entire surface including the optical elements. In this case, a configuration may be adopted in which the protective film is formed by a material having a refractive index different from a refractive index of a material constituting the optical elements. The direction of emanating light can be adjusted not only by the shape of the interface between the optical element and the protective film, but also by the magnitude relationship between the refractive index of the protective film and that of the optical element. Note that, as the material constituting the transparent layer and the material constituting the protective film, suitable materials appropriately selected from transparent organic materials and inorganic materials may be used.

The light emitting device of the present disclosure including the above-described various preferable configurations may have a configuration in which the optical elements cut along a plane orthogonal to the light emitting region have a cross-sectional shape that is any one of a circular shape, a trapezoidal shape, a rectangular shape, and a polygonal shape, or a shape obtained by combining any of these shapes. Note that the "circular shape" includes a case of, for example, a semicircular shape.

The light emitting device of the present disclosure including the above-described various preferable configurations may have a configuration in which a light shielding layer is formed between each of the light emitting elements adjacent to each other. The position of the light shielding layer is not particularly limited as long as the operation of the light emitting device is not hindered. From the viewpoint of efficient light shielding, it is preferable to adopt a configuration in which the light shielding layer is arranged on the lower layer side of the optical element. The material constituting the light shielding layer is not particularly limited, and, for example, a metal material such as chromium (Cr) or a black organic material may be appropriately selected and used.

The light emitting device of the present disclosure including the above-described various preferable configurations may have a configuration in which the optical elements are arranged in such a way that positional relationships between centers of the light emitting elements and centers of the optical elements that correspond to each other are substantially coincident. Alternatively, a configuration may be adopted in which the optical elements are arranged in such a way that positional relationships between centers of the light emitting elements and centers of the optical elements that correspond to each other have a predetermined deviation amount. Alternatively, a configuration may be adopted in which the optical elements are arranged in such a way that positional relationships between centers of the light emitting elements and centers of the optical elements have a deviation amount that changes in accordance with positions of the light emitting elements in the light emitting region.

The light emitting device of the present disclosure including the above-described various preferable configurations may have a configuration in which the light emitting element is constituted by an organic electroluminescence element, an LED element, a semiconductor laser element, or the like. They can be constituted with the use of a well-known material and method. From the viewpoint of configuring a planar light emitting device, it is particularly preferable that the light emitting element is constituted by an organic electroluminescence element.

In this case, a configuration may be adopted in which the light emitting elements have a resonator structure that resonates light. Furthermore, the light emitting element may include a drive circuit. The light emitting element and the drive circuit can be connected via, for example, a conductive portion constituted by a via or the like provided in an interlayer insulating film.

The light emitting region constituted by light emitting elements arranged in a matrix is formed on a substrate, for example. Examples of a constituent material of the substrate include a semiconductor material, a glass material, and a plastic material. In a case where the drive circuit is constituted by a transistor formed on a semiconductor substrate, for example, a well region may be provided on a semiconductor substrate constituted by silicon, and a transistor may be formed in the well. On the other hand, in a case where the drive circuit is constituted by a thin film transistor or the like, it is possible to form the drive circuit by using a substrate constituted by a glass material or a plastic material and forming a semiconductor thin film on the substrate. Various wirings having known configurations and structures can be used.

In the light emitting device of the present disclosure, the configuration of the drive circuit or the like that controls light emission of the light emitting element is not particularly limited. The light emitting element may be formed, for example, in a certain plane on the substrate, and may be arranged, for example, via an interlayer insulating layer above the drive circuit that drives the light emitting element. The configuration of the transistor constituting the drive circuit is not particularly limited. A p-channel field effect transistor or an n-channel field effect transistor may be used.

In the light emitting device of the present disclosure, the light emitting element may be of a so-called top emission type. For example, the light emitting element constituted by an organic electroluminescence element has a configuration in which an organic layer including a hole transport layer, a light emitting layer, an electron transport layer, and the like is sandwiched between a first electrode and a second electrode. In a case where a common cathode is used, the second electrode serves as a cathode electrode, and the first electrode serves as an anode electrode.

The first electrode is provided for each light emitting element on the substrate. In a case where a common cathode is used, the first electrode functions as an anode electrode of the light emitting element. The first electrode can be constituted with the use of a metal such as aluminum (Al), an aluminum alloy, platinum (Pt), gold (Au), chromium (Cr), or tungsten (W), an alloy thereof, or the like. Alternatively, a configuration may be adopted in which a transparent conductive material layer of indium tin oxide (ITO), indium zinc oxide (IZO), or the like and a reflective layer constituted by a light reflective material are laminated. The second electrode is provided as a common electrode for each light emitting element, and can be constituted with the use of, for example, a mixed layer of magnesium (Mg) and silver (Ag), a metal such as silver (Ag), or a transparent conductive material layer of indium tin oxide (ITO), indium zinc oxide (IZO), or the like.

The organic layer is formed by laminating a plurality of material layers, and is provided, as a common continuous film, on the entire surface including the first electrode and a partition wall. The organic layer emits light when a voltage is applied between the first electrode and the second electrode. The organic layer can have a structure in which, for example, a hole injection layer, a hole transport layer, a light emitting layer, an electron transport layer, and an electron injection layer are laminated in this order from the first electrode side. A hole transport material, a hole transport material, an electron transport material, and an organic light emitting material constituting the organic layer are not particularly limited, and known materials can be used.

The organic layer may include a structure in which a plurality of light emitting layers is laminated. For example, a light emitting element that emits white light can be configured by laminating light emitting layers that emit red light, blue light, and green light, or by laminating light emitting layers that emit blue light and yellow light. Alternatively, a light emitting layer may be applied to each light emitting element in accordance with the color to be displayed.

The light emitting device of the present disclosure can have a configuration for color display. Note that, in some cases, a configuration for so-called monochrome display may be adopted. In a case of monochrome display, one light emitting element constitutes one pixel.

Furthermore, in a case of color display, one light emitting element constitutes one sub-pixel. For example, one pixel may be constituted by a plurality of sub-pixels. Specifically, one pixel may be constituted by three sub-pixels, that is, a red display sub-pixel, a green display sub-pixel, and a blue display sub-pixel. Furthermore, one pixel may be constituted by one set obtained by adding another type of sub-pixel or a plurality of types of sub-pixels to the three types of sub-pixels (e.g., one set in which a sub-pixel that emits white light is added for an improvement in brightness, one set in which a sub-pixel that emits light of a complementary color is added for an expansion of the range of color reproduction, one set in which a sub-pixel that emits yellow light is added for an expansion of the range of color reproduction, and one set in which sub-pixels that emit yellow light and cyan light are added for an expansion of the range of color reproduction).

The partition wall defining adjacent light emitting elements can be formed with the use of a material appropriately selected from known inorganic materials and organic materials, and can be formed by, for example, a combination of a known film forming method such as a physical vapor deposition method (PVD method) exemplified by a vacuum vapor deposition method or a sputtering method, or various chemical vapor deposition methods (CVD methods), and a known patterning method such as an etching method or a lift-off method.

Examples of the value of the pixel of the light emitting device include some image display resolutions such as (1920, 1035), (720, 480), and (1280, 960), besides VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536), but the value is not limited to these values.

Examples of the electronic device including the light emitting device of the present disclosure include not only direct view type and projection type light emitting devices but also various electronic devices having an image display function.

Various conditions in the present specification are satisfied not only in a case where the conditions are strictly met but also in a case where the conditions are substantially met. Presence of various variations caused by design or manufacturing is permissible. Furthermore, each of the drawings used in the following description is schematic, and does not indicate actual dimensions or ratios thereof.

First Embodiment

A first embodiment relates to a light emitting device and an electronic device according to the present disclosure.

Figure 2:
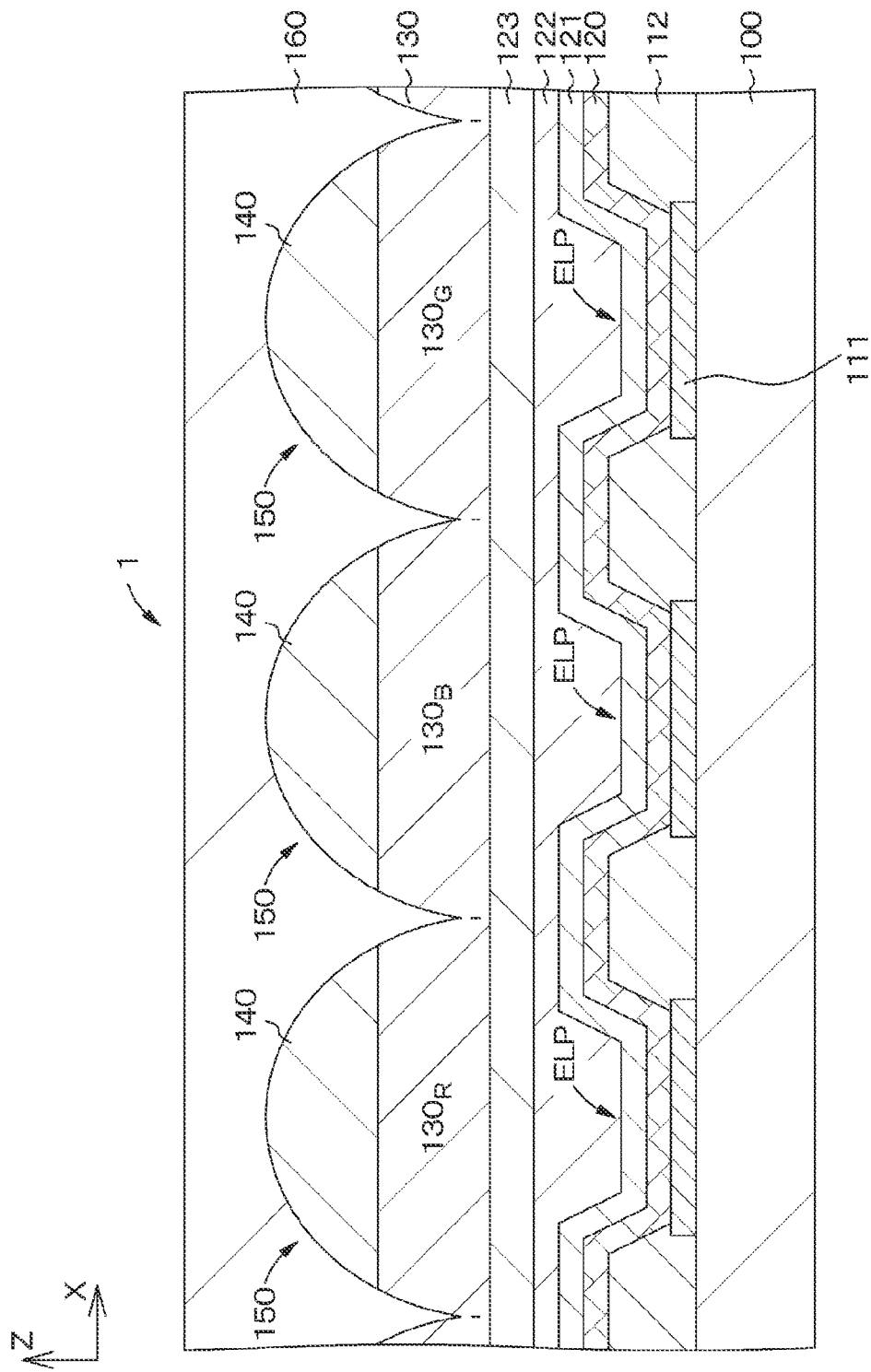
FIG. 2 is a schematic partial cross-sectional view of a substrate and the like for illustrating a structure of the light emitting device.
Figure 3:
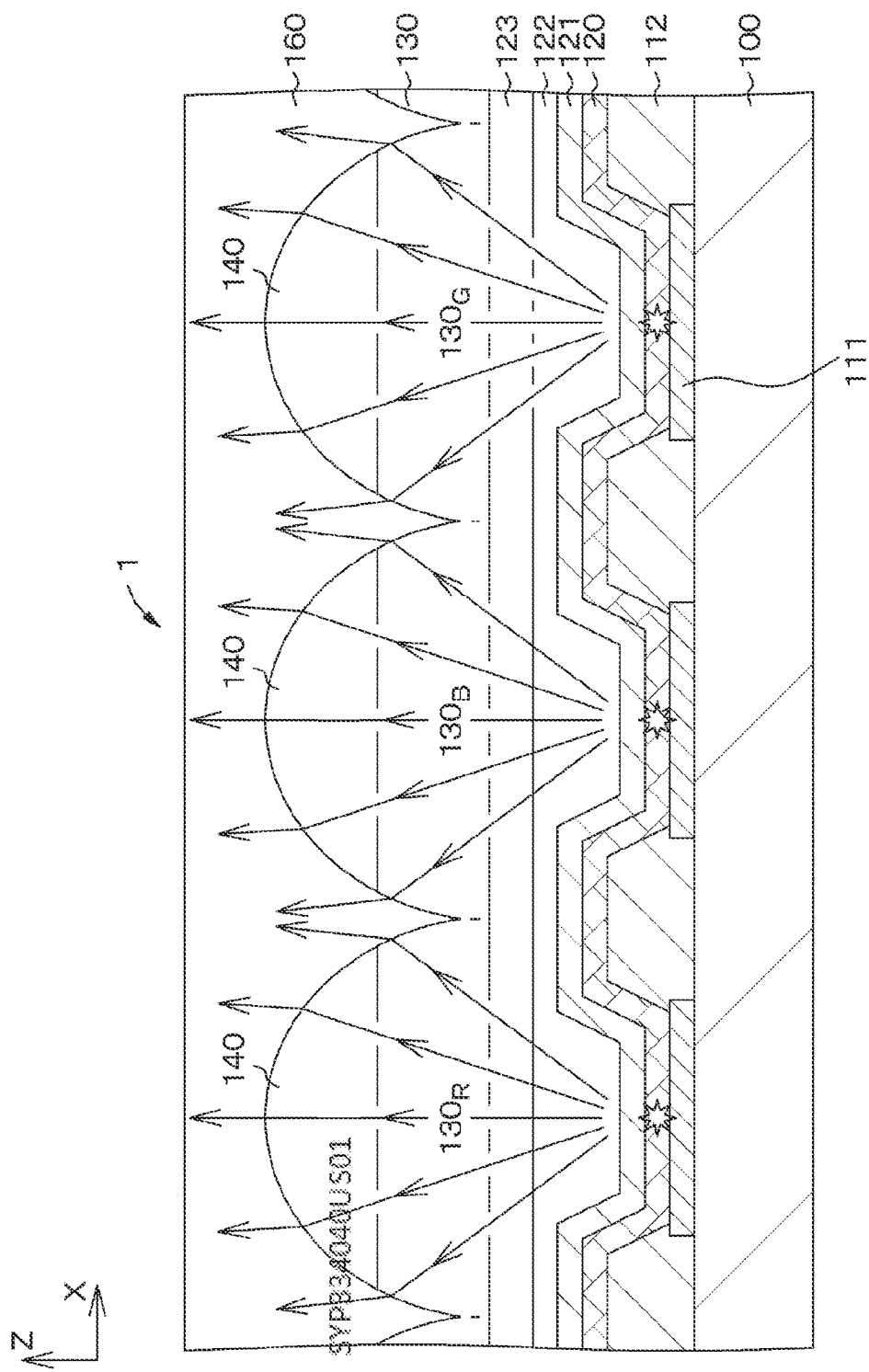
FIG. 3 is a schematic partial cross-sectional view of a substrate and the like for illustrating adjustment of the direction of emanating light by an optical element.

FIG. 1 is a schematic plan view for illustrating the light emitting device according to the first embodiment. FIG. 2 is a schematic partial cross-sectional view of a substrate and the like for illustrating a structure of the light emitting device. FIG. 3 is a schematic partial cross-sectional view of a substrate and the like for illustrating adjustment of the direction of emanating light by an optical element. Note that, for convenience of illustration, hatching is omitted for some components in FIG. 3. The same applies to FIG. 25 described later.

As illustrated in FIG. 1, a light emitting device 1 includes a substrate 100 and a light emitting region LP constituted by light emitting elements ELP arranged in a matrix on the substrate 100. Then, as illustrated in FIG. 2, optical elements 150 that are formed in such a way as to correspond to the light emitting elements ELP and configured to adjust the direction of emanating light are included. The light emitting device 1 is capable of displaying color. In FIG. 1, the light emitting elements ELP corresponding to red display, blue display, and green display are denoted by reference characters R, B, and G, respectively.

The structure of the light emitting device 1 will be described in detail with reference to FIG. 2. The light emitting elements ELP are constituted by organic electroluminescence elements. The organic electroluminescence elements have a configuration in which an organic layer including a light emitting layer and a second electrode are sequentially laminated on a first electrode 111 provided for each of the light emitting elements ELP. Note that, for convenience of illustration, the organic layer is indicated as one layer 120 in FIG. 2. Note that the organic layer is formed so as to emit white light. A second electrode 121 constituted by, for example, a transparent conductive material is formed on the entire surface including the organic layer 120, and a protective layer 122 and a planarization layer 123 are further formed thereon.

A partition wall 112 constituted by an insulating material is provided between each of the first electrodes 111 adjacent to each other, thereby defining each of the light emitting elements ELP. Although not illustrated, a drive circuit provided for each of the light emitting elements ELP is formed on the substrate 100. Light emitting states of the light emitting elements ELP are controlled in accordance with a signal from the outside.

As illustrated in FIG. 2, the display device 1 includes optical elements that are formed in such a way as to correspond to the light emitting elements ELP and configured to adjust the direction of emanating light. More specifically, the included optical elements 150 are formed in such a way that one of a color filter layer 130 and a transparent layer 140 is formed to constitute a lower layer portion on an incident side and the other is formed to constitute an upper layer portion on an emanating side, and the upper layer portion and at least a part of the lower layer portion are formed to be exposed to an interface with the outside. As illustrated in FIG. 2, the optical elements 150 have a convex lens shape in cross section. The interfaces between the upper layer portions and the lower layer portions of the optical elements 150 are planar.

The display device 1 includes the optical elements 150 in which the color filter layer 130 is formed to constitute the lower layer portion on the incident side and the transparent layer 140 is formed to constitute the upper layer portion on the emanating side. The color filter layer 130 constituting the lower layer portion has a portion that remains unexposed to the interface on the planarization layer 123 side. A transparent protective film 160 is formed on the entire surface including the optical elements 150. The optical elements 150 are arranged in such a way that positional relationships between the centers of the light emitting elements ELP and the centers of the light emitting elements 150 that correspond to each other are substantially coincident. The material constituting the protective film 160 may be appropriately selected in consideration of the characteristic related to adjustment of the direction of emanating light by the optical elements 150 and the like. Here, it is assumed that the protective film 160 is constituted by a material having a smaller refractive index than the material constituting the optical elements 150. As illustrated in FIG. 3, the optical elements 150 adjust the direction of emanating light so as to collect light from the light emitting elements ELP.

The color filter layer 130 illustrated in FIG. 2 is constituted by, for example, a resist material that includes fine particles constituting a coloring material and/or quantum dots. A red color filter layer $130_R$ is formed on the light emitting element ELP corresponding to red display, a blue color filter layer $130_B$ is formed on the light emitting element ELP corresponding to blue display, and a green color filter layer $130_G$ is formed on the light emitting element ELP corresponding to green display. Thus, white light from the light emitting element ELP is incident on the color filter layer 130. Then, light corresponding to the color filter layer 130 emanates via the optical element 150.

In order to secure the lens power of the optical element 150, it is necessary to increase the thickness of the optical element 150 to some extent. The optical element 150 has a configuration in which the color filter layer 130 and the transparent layer 140 are laminated, and this structure facilitates securing of the thickness. According to this structure, the thickness of the color filter layer 130 can be determined with emphasis on the characteristic related to efficient extraction of light of a predetermined wavelength, and the thickness of the transparent layer 140 can be determined with emphasis on the characteristic related to adjustment of the direction of emanating light. It is therefore an object of the present disclosure to achieve a suitable balance between the characteristic related to adjustment of the direction of emanating light and the characteristic related to efficient extraction of light of a predetermined wavelength.

Note that, although the optical element 150 has a convex lens shape on the light emanating side in the drawings, this is an example, and the shape can be appropriately selected in accordance with specifications required of the optical element as long as the optical element has a function of adjusting the direction of emanating light as illustrated in the present example. For example, the light emitting element 150 cut along a plane orthogonal to the light emitting region may have a cross-sectional shape that is any one of a circular shape, a trapezoidal shape, a rectangular shape, and a polygonal shape, or a shape obtained by combining any of these shapes. Hereinafter, examples of the shape the optical element 150 will be described with reference to the drawings.

Figure 4A:
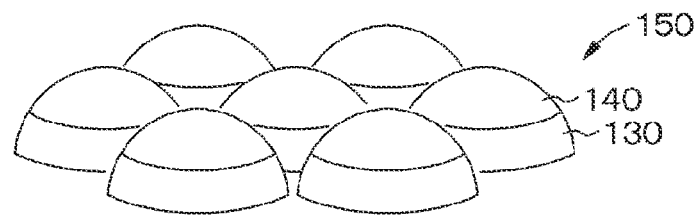
FIGS. 4A, 4B, 4C, 4D, and 4E are schematic overhead views for illustrating the shape of the optical element.
Figure 4B:
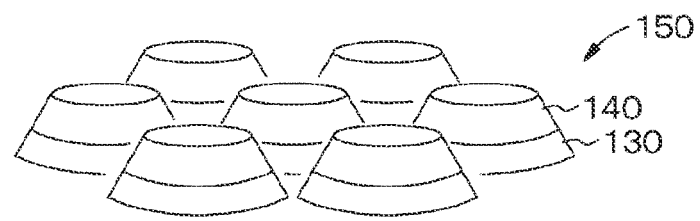
Figure 4C:
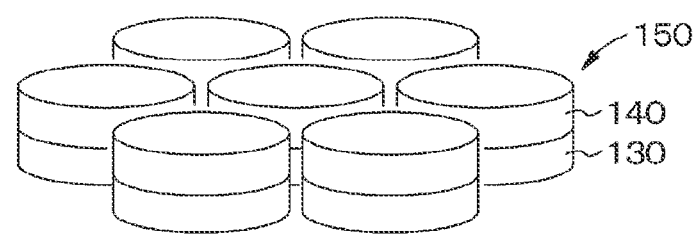
Figure 4D:
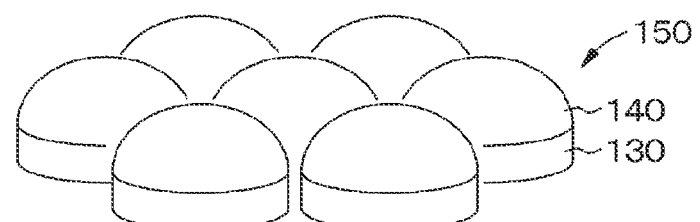
Figure 4E:
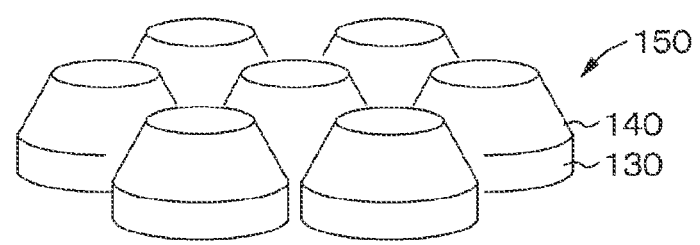

FIGS. 4A, 4B, 4C, 4D, and 4E are schematic overhead views for illustrating the shape of the optical element. They illustrate cases where the lower layer side of the optical element 150 is circular. FIG. 4A illustrates an example where the cross-sectional shape is circular. FIG. 4B illustrates an example where the cross-sectional shape is trapezoidal. FIG. 4C illustrates an example where the cross-sectional shape is rectangular. FIG. 4D illustrates an example where the cross-sectional shape is a combination of a rectangular shape and a circular shape. FIG. 4E illustrates an example where the cross-sectional shape is a combination of a rectangular shape and a trapezoidal shape.

Figure 5A:
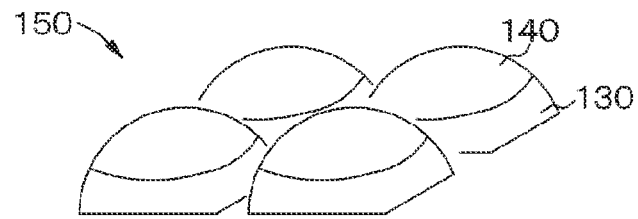
FIGS. 5A, 5B, 5C, 5D, and 5E are schematic overhead views for illustrating the shape of the optical element, following FIG. 4E.
Figure 5B:
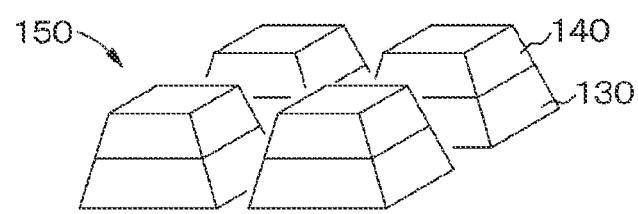
Figure 5C:
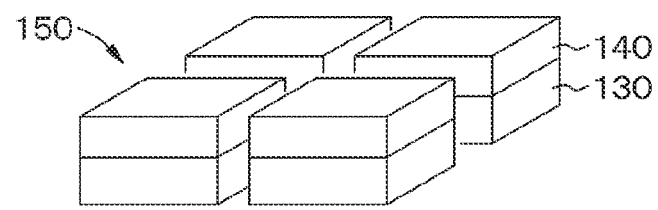
Figure 5D:
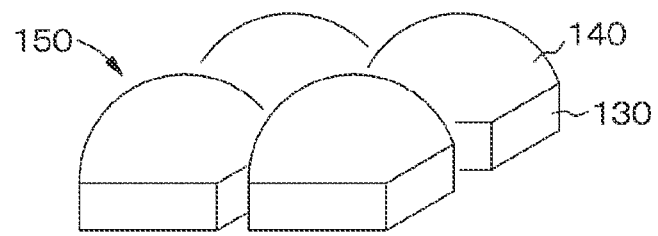
Figure 5E:
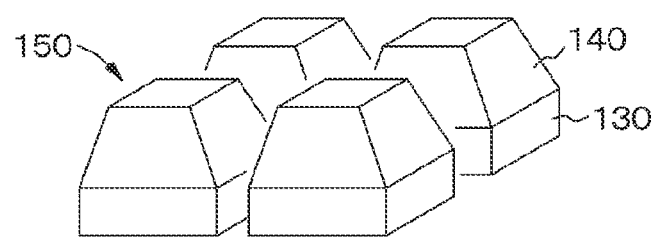

FIGS. 5A, 5B, 5C, 5D, and 5E are also schematic overhead views for illustrating the shape of the optical element. They illustrate cases where the lower layer side of the optical element 150 is rectangular (square). FIG. 5A illustrates an example where the cross-sectional shape is circular. FIG. 5B illustrates an example where the cross-sectional shape is trapezoidal. FIG. 5C illustrates an example where the cross-sectional shape is rectangular. FIG. 5D illustrates an example where the cross-sectional shape is a combination of a rectangular shape and a circular shape. FIG. 5E illustrates an example where the cross-sectional shape is a combination of a rectangular shape and a trapezoidal shape.

The structure of the light emitting device 1 has been described above in detail. The description will be followed by a description of a method of manufacturing the light emitting device 1 according to the first embodiment.

FIGS. 6A, 6B, 7, 8, and 9 are schematic partial cross-sectional views of a substrate and the like for illustrating the method of manufacturing the light emitting device according to the first embodiment.

[Step-100] (See FIGS. 6A and 6B)

The substrate 100 illustrated in FIG. 2 is prepared (see FIG. 6A), and the light emitting region LP constituted by the light emitting elements ELP arranged in a matrix is formed on the substrate 100 (see FIG. 6B). Specifically, the first electrodes 111 corresponding to the light emitting elements ELP are formed on the substrate 100. Next, the organic layer 120 including a light emitting layer, the second electrode 121, the protective layer 122, and the planarization layer 123 are sequentially formed.

Figure 8:
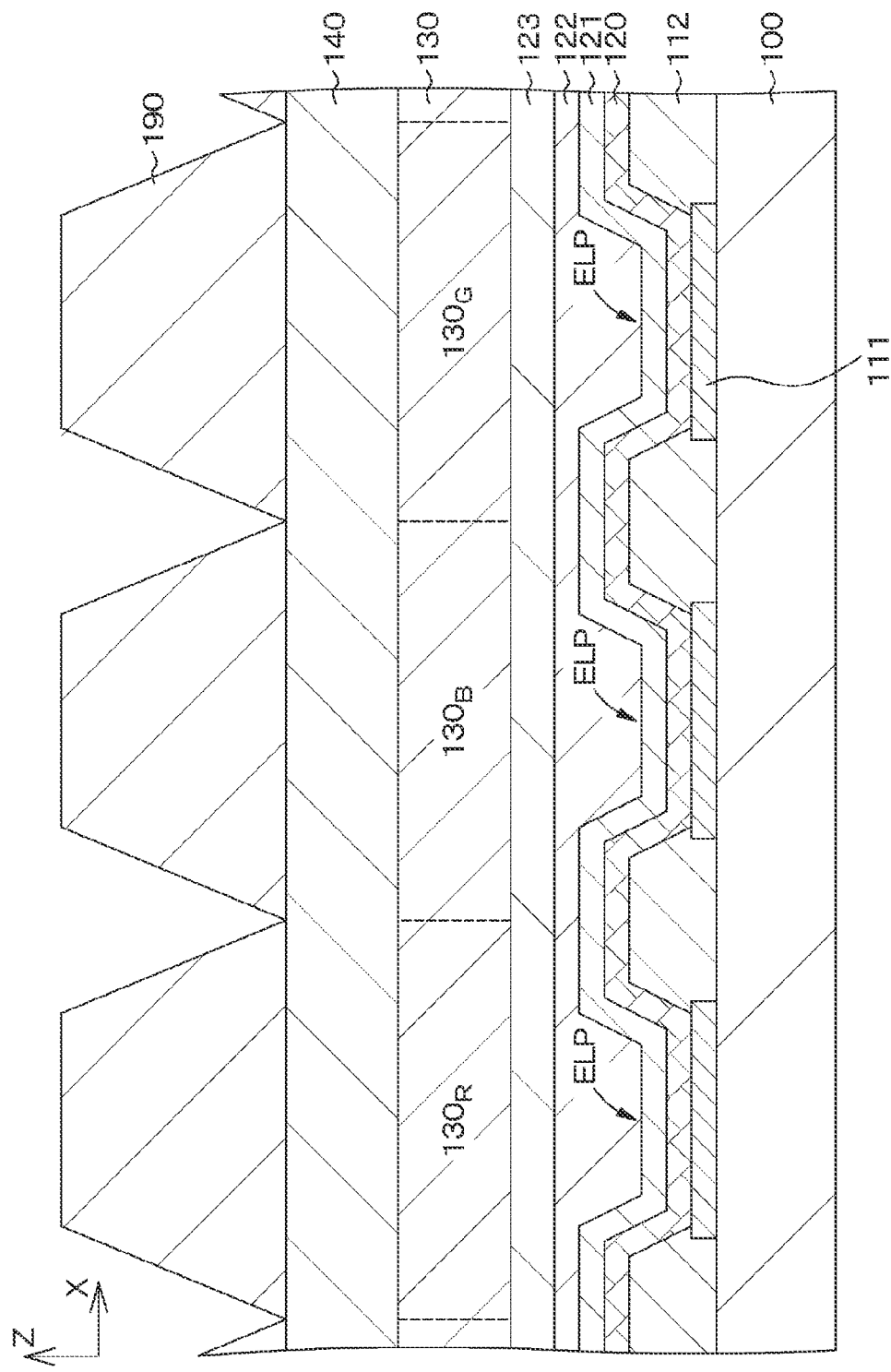
FIG. 8 is a schematic partial cross-sectional view of a substrate and the like for illustrating the method of manufacturing the light emitting device according to the first embodiment, following FIG. 7.
Figure 9:
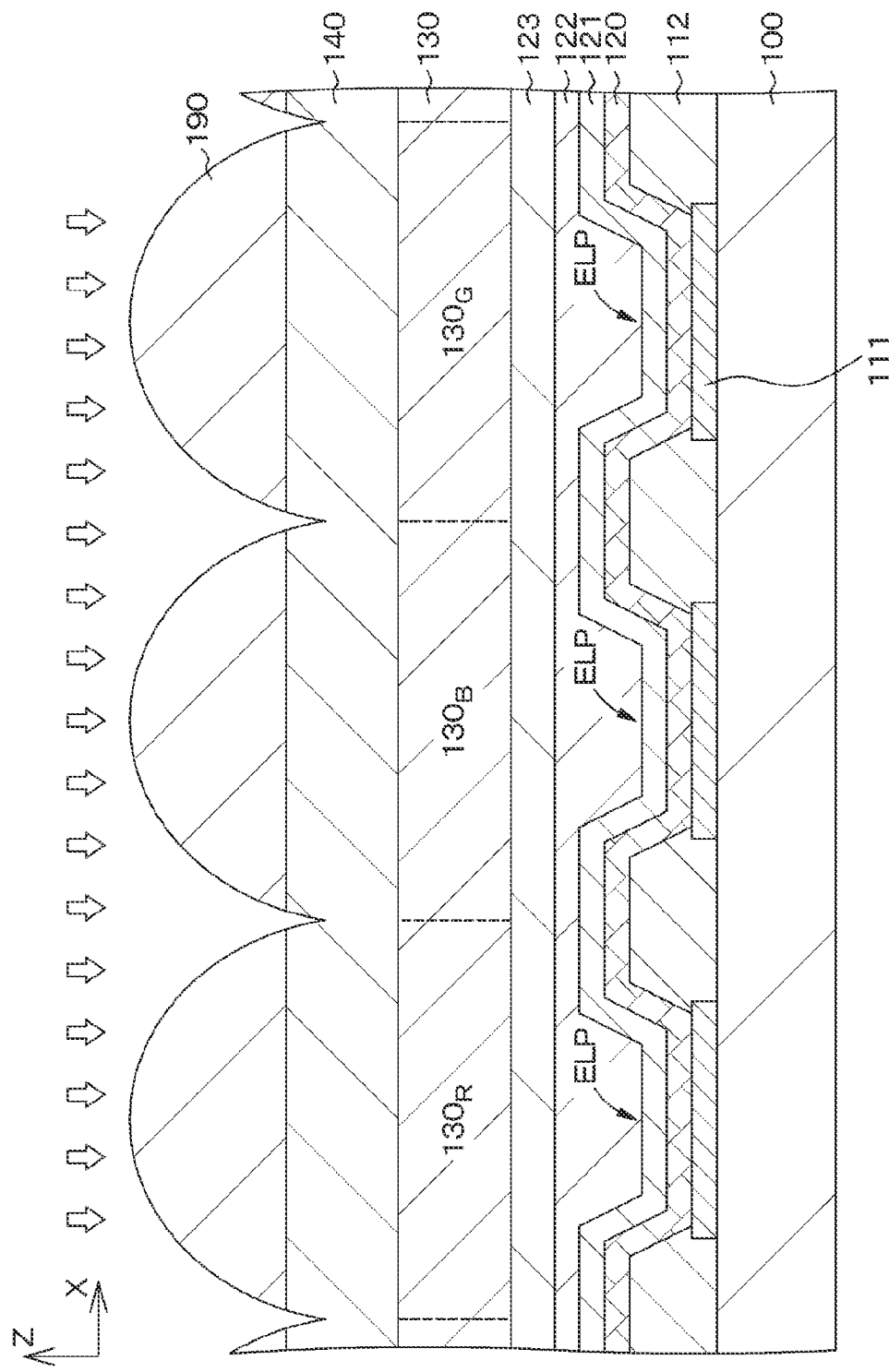
FIG. 9 is a schematic partial cross-sectional view of a substrate and the like for illustrating the method of manufacturing the light emitting device according to the first embodiment, following FIG. 8.

[Step-110] (See FIGS. 7, 8, and 9)

Next, the optical elements 150 corresponding to the light emitting elements ELP are formed. First, the color filter layer 130 is formed on the planarization layer 123 by a known method. Thereafter, the transparent layer 140 is formed thereon (see FIG. 7).

Next, a resist 190 for forming optical elements is formed on the transparent layer 140. For example, the resist 190 on a trapezoid is formed (see FIG. 8).

Thereafter, for example, dry etching processing is performed so that the resist 190, the transparent layer 140, and the color filter layer 130 are etched. FIG. 9 schematically illustrates a state during the etching processing. The thicker the resist 190, the less the base is etched. Thus, the optical elements 150 in which the upper layer portion is constituted by the transparent layer 140 and the lower layer portion is constituted by the color filter layer 130 are formed.

[Step-120]

Thereafter, the protective film 160 is formed on the entire surface including the optical elements 150. The light emitting device 1 can be obtained by the steps described above.

Note that a transparent counter substrate may be arranged on the protective film 160 as necessary. Alternatively, a configuration may be adopted in which, for example, the optical elements 150 are formed on the counter substrate side, and then affixed separately.

The method of manufacturing the light emitting device 1 has been described above.

The first embodiment can be variously modified. Hereinafter, various modifications will be described.

Figure 10:
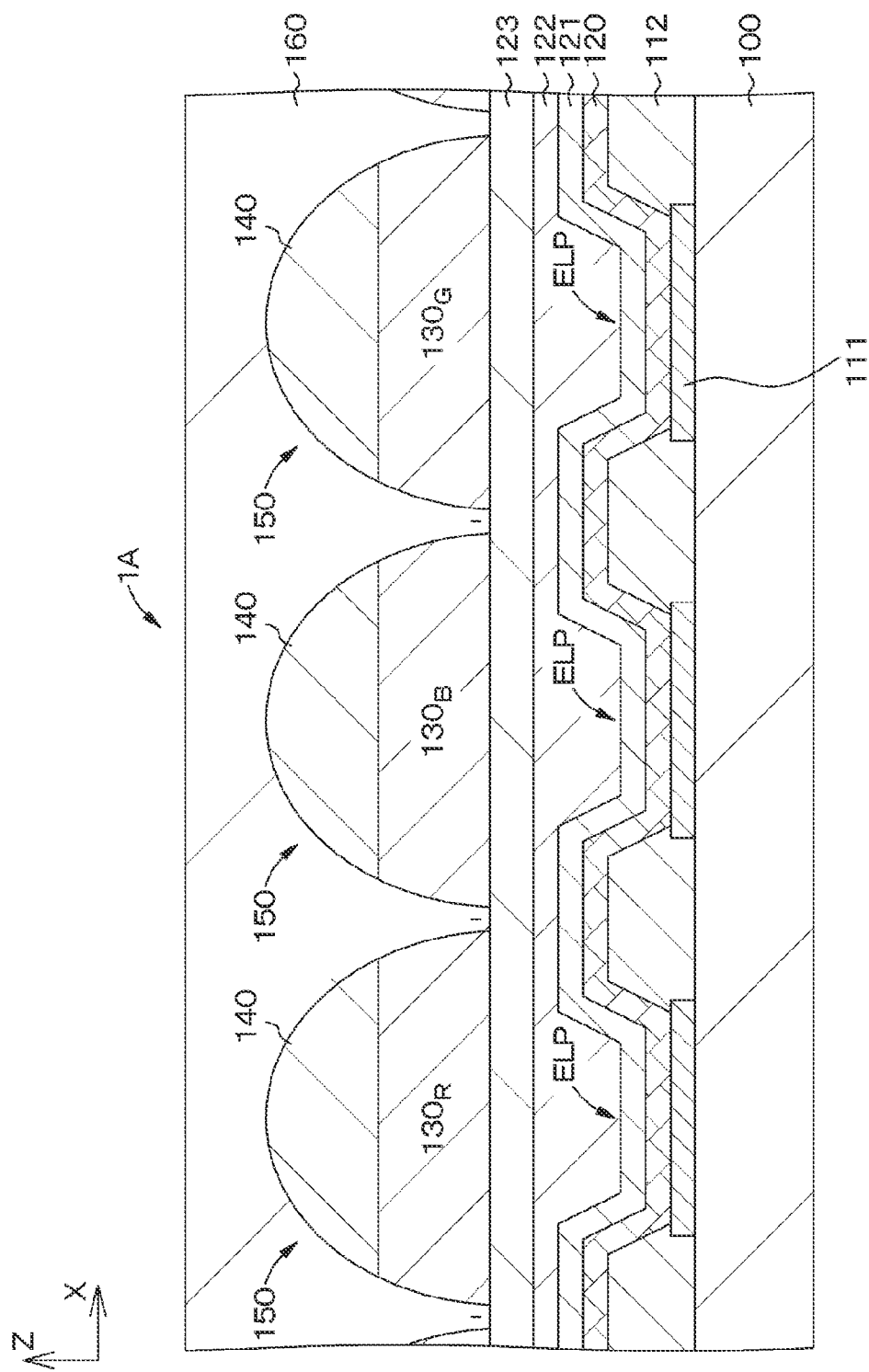
FIG. 10 is a schematic partial cross-sectional view of a substrate and the like for illustrating a light emitting device according to a first modification of the first embodiment.

FIG. 10 is a schematic partial cross-sectional view of a substrate and the like for illustrating a light emitting device according to a first modification of the first embodiment.

The optical elements 150 of the light emitting device 1 illustrated in FIG. 2 have a structure in which, since the color filter layer 130 constituting the lower layer portion has a portion that remains unexposed to the interface, a part of the color filter layer 130 is exposed to the interface with the outside. On the other hand, a light emitting device 1A illustrated in FIG. 10 is different in that etching processing is performed such that the entire color filter layer 130 constituting the lower layer portion is exposed to the interface with the outside.

Figure 11:
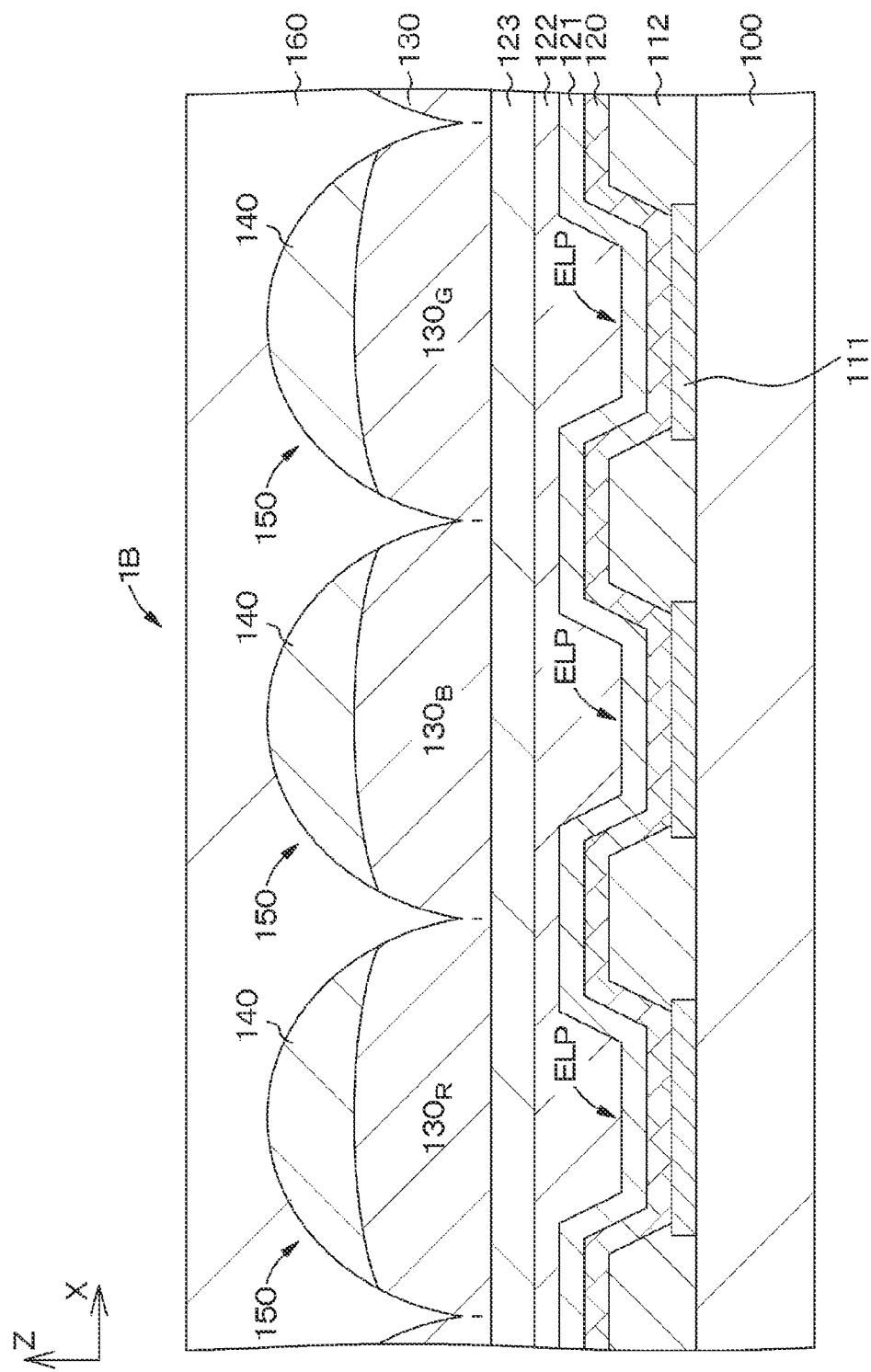
FIG. 11 is a schematic partial cross-sectional view of a substrate and the like for illustrating a light emitting device according to a second modification of the first embodiment.
Figure 12:
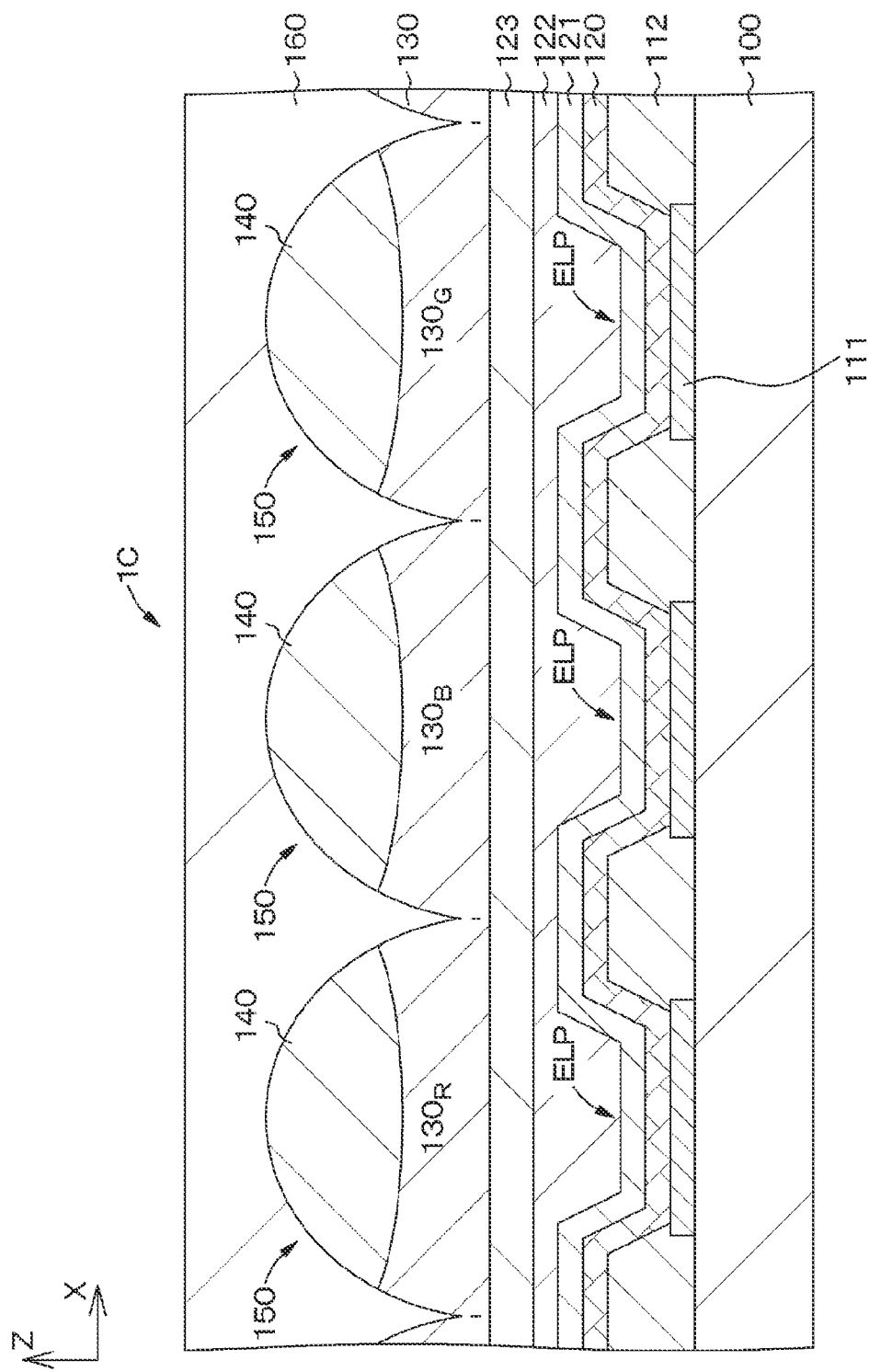
FIG. 12 is a schematic partial cross-sectional view of a substrate and the like for illustrating a light emitting device according to a third modification of the first embodiment.

FIG. 11 is a schematic partial cross-sectional view of a substrate and the like for illustrating a light emitting device according to a second modification of the first embodiment. Furthermore, FIG. 12 is a schematic partial cross-sectional view of a substrate and the like for illustrating a light emitting device according to a third modification of the first embodiment.

In the light emitting device 1 illustrated in FIG. 2, the interface between the upper layer portion and the lower layer portion of the optical element 150 is planar. On the other hand, a light emitting device 1B illustrated in FIG. 11 or a light emitting device 1C illustrated in FIG. 11 has a difference in that the interface between the upper layer portion and the lower layer portion of the light emitting element 150 is curved.

For example, the color filter layer 130 is patterned in accordance with each light emitting element ELP, and the upper surface of the color filter layer 130 is curved in the process in some cases. In such a case, the interface between the color filter layer 130 and the transparent layer 140 is curved. FIG. 11 illustrates an example of a case where the upper surface of the color filter layer 130 is a convex curved surface, and FIG. 12 illustrates an example where the upper surface of the color filter layer 130 is a concave curved surface.

Figure 13:
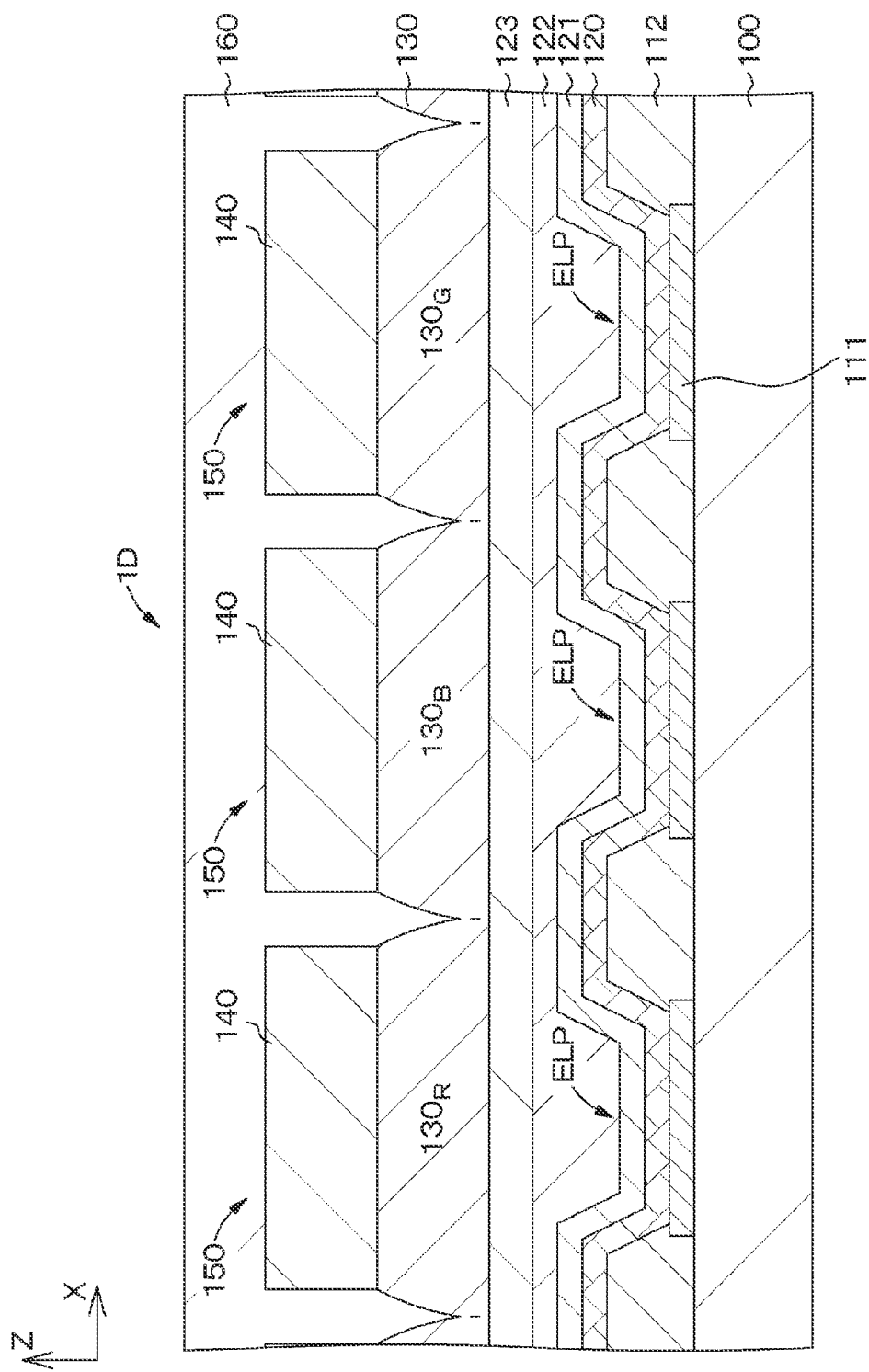
FIG. 13 is a schematic partial cross-sectional view of a substrate and the like for illustrating a light emitting device according to a fourth modification of the first embodiment.
Figure 14:
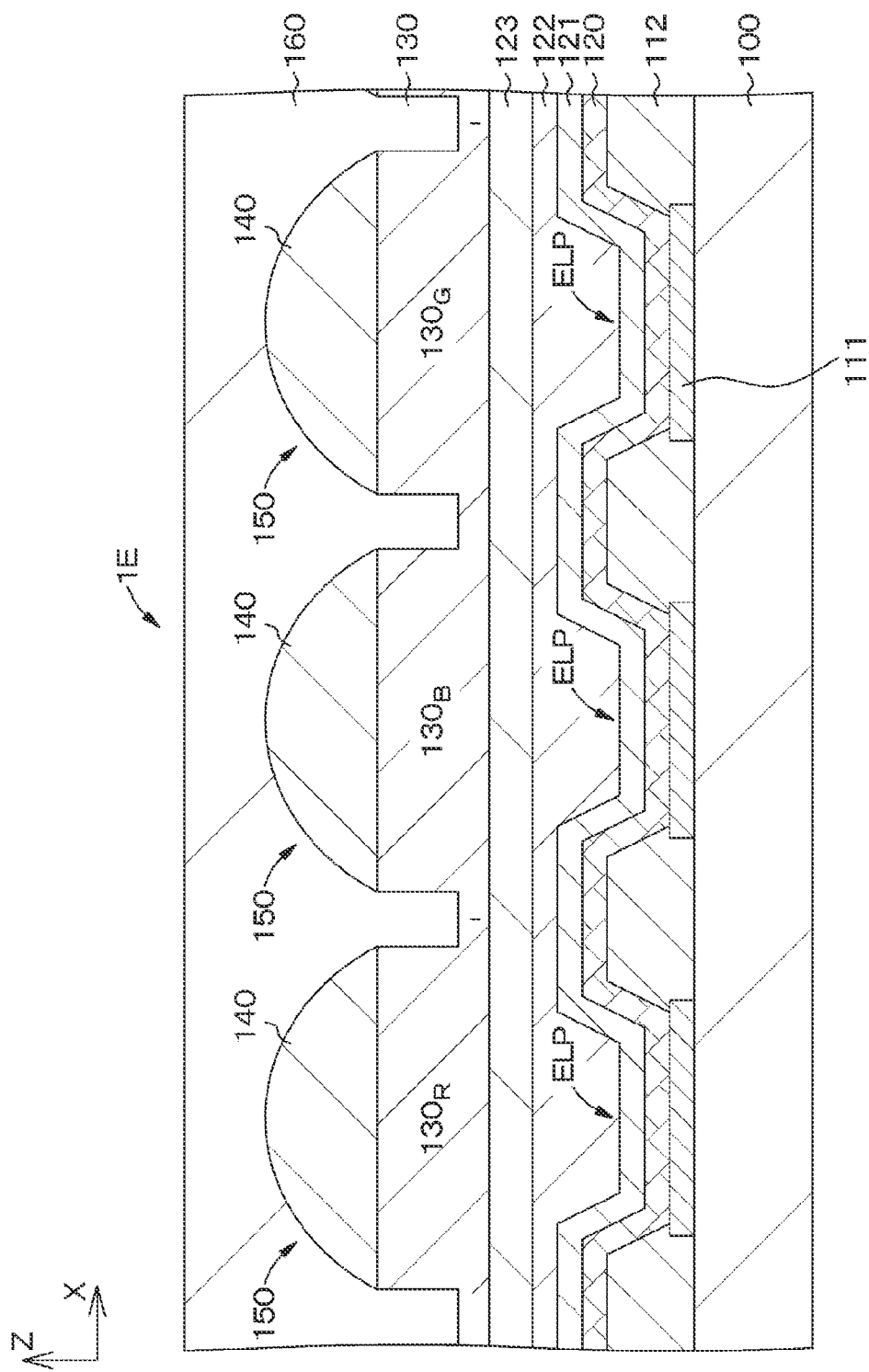
FIG. 14 is a schematic partial cross-sectional view of a substrate and the like for illustrating a light emitting device according to a fifth modification of the first embodiment.

FIG. 13 is a schematic partial cross-sectional view of a substrate and the like for illustrating a light emitting device according to a fourth modification of the first embodiment. Furthermore, FIG. 14 is a schematic partial cross-sectional view of a substrate and the like for illustrating a light emitting device according to a fifth modification of the first embodiment.

A difference in etching characteristics between the material of the upper layer portion and the material of the lower layer portion constituting the light emitting element 150 results in a difference in shape after etching processing. A light emitting device 1D illustrated in FIG. 13 has a configuration in which the transparent layer 140 constituting the upper layer portion is etched so as to be rectangular in a cross section, and the color filter layer 130 constituting the lower layer portion is etched so as to be trapezoidal in a cross section. A light emitting device 1E illustrated in FIG. 14 has a configuration in which the transparent layer 140 constituting the upper layer portion is etched so as to be circular in a cross section, and the color filter layer 130 constituting the lower layer portion is etched so as to be rectangular in a cross section.

Figure 15:
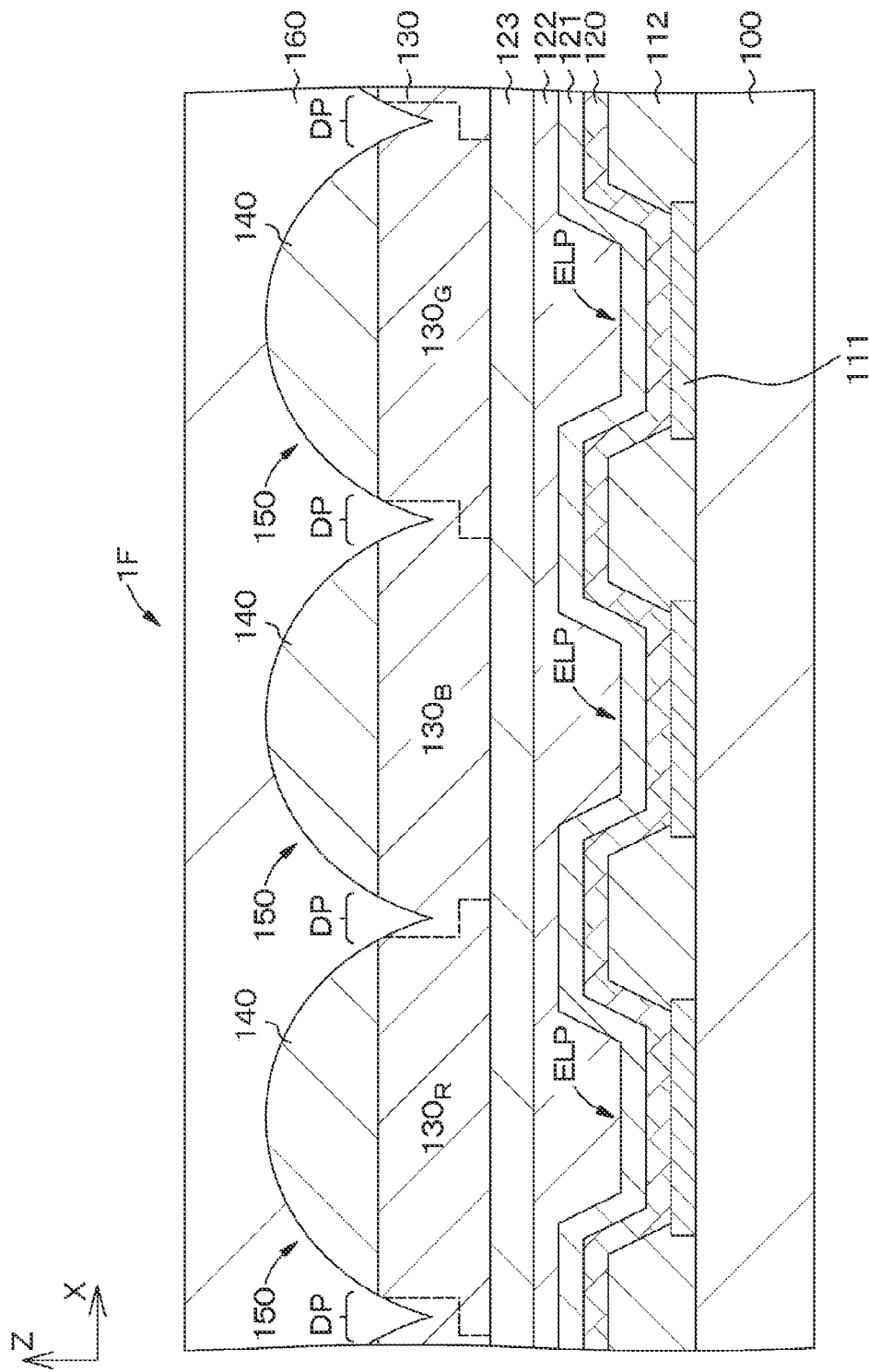
FIG. 15 is a schematic partial cross-sectional view of a substrate and the like for illustrating a light emitting device according to a sixth modification of the first embodiment.

FIG. 15 is a schematic partial cross-sectional view of a substrate and the like for illustrating a light emitting device according to a sixth modification of the first embodiment.

In a light emitting device 1F illustrated in FIG. 15, color filter layers of different types are formed in such a way as to be laminated in a region (denoted by a reference character DP) between each of the light emitting elements 150 adjacent to each other. The difference from the light emitting device 1 illustrated in FIG. 2 is as described above.

In the portion where the color filter layers of different types are laminated, transmission of light is hindered. With this arrangement, it is possible to prevent color mixing due to light leakage from adjacent light emitting elements ELP.

Figure 16:
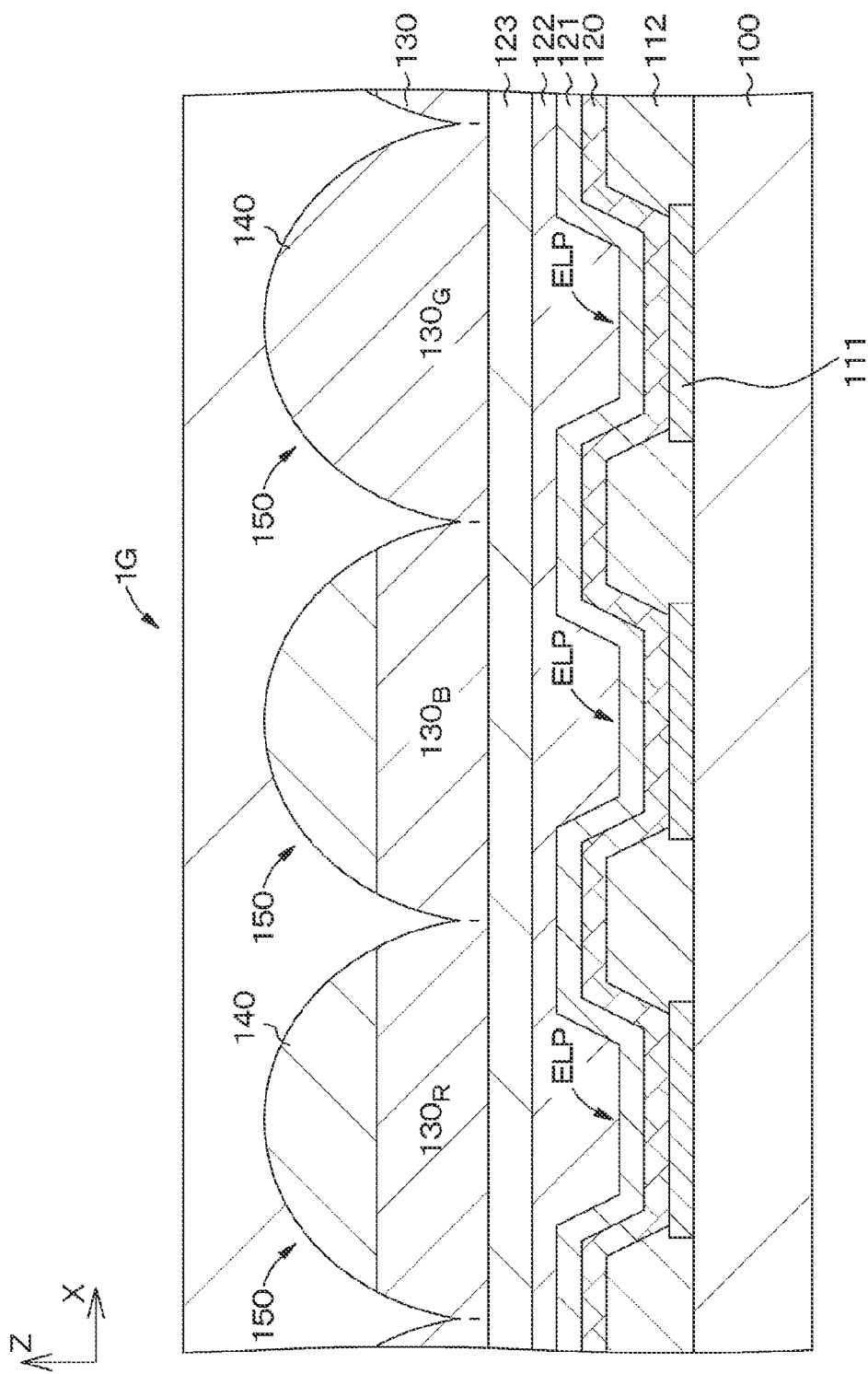
FIG. 16 is a schematic partial cross-sectional view of a substrate and the like for illustrating a light emitting device according to a seventh modification of the first embodiment.

FIG. 16 is a schematic cross-sectional view of a part of a light emitting device according to a seventh modification of the first embodiment.

A light emitting device 1G illustrated in FIG. 16 further includes a light emitting element 150 entirely formed by a color filter layer. More specifically, the optical element 150 arranged on the light emitting element ELP involved in green display is entirely constituted by the color filter layer $130_G$. The difference from the light emitting device 1 illustrated in FIG. 2 is as described above.

Figure 17:
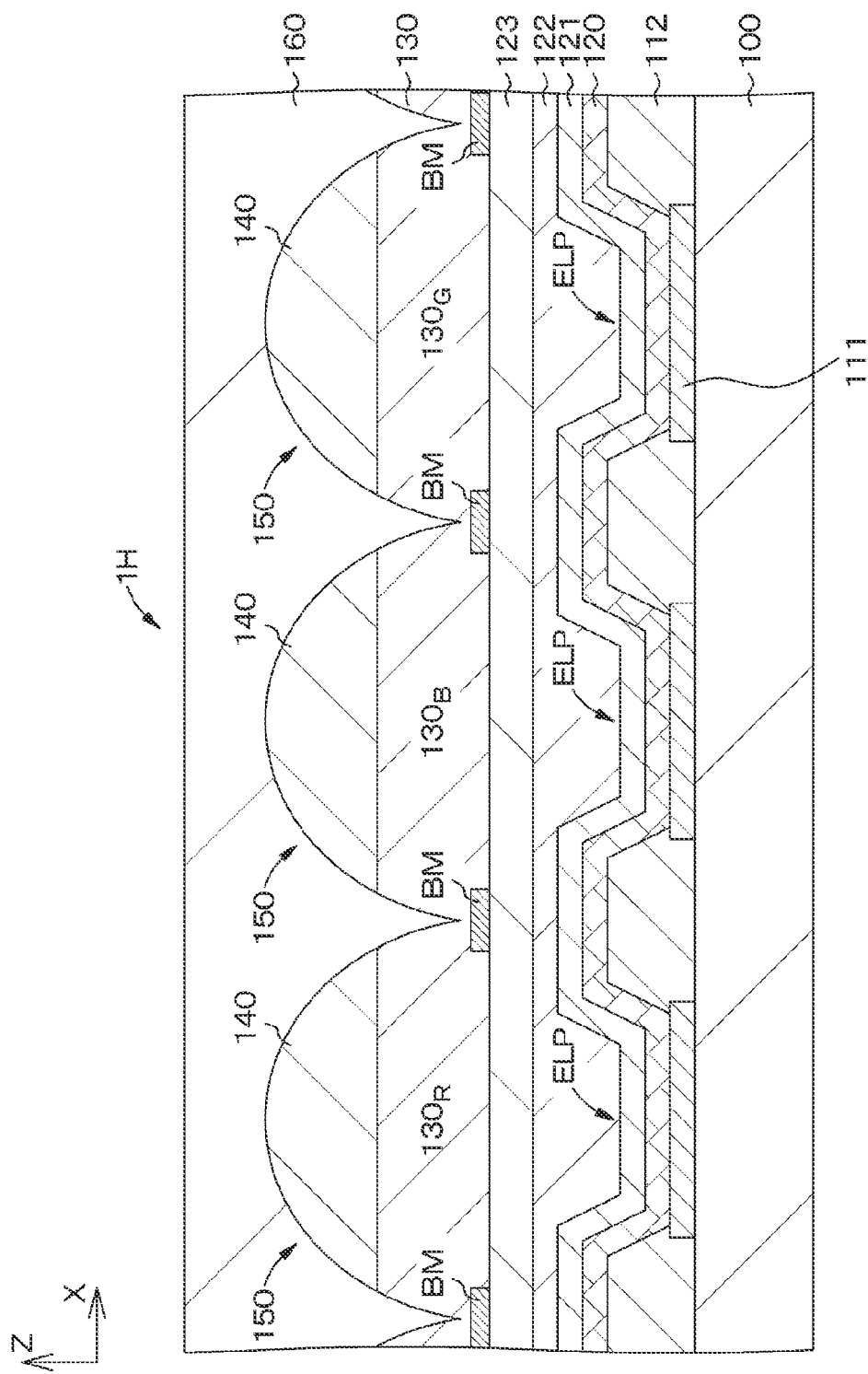
FIG. 17 is a schematic partial cross-sectional view of a substrate and the like for illustrating a light emitting device according to an eighth modification of the first embodiment.

FIG. 17 is a schematic partial cross-sectional view of a substrate and the like for illustrating a light emitting device according to an eighth modification of the first embodiment.

In a light emitting device 1H illustrated in FIG. 17, a light shielding layer BM is formed between each of the light emitting elements ELP adjacent to each other. The light shielding layer BM is formed by patterning a chromium film or the like formed on the planarization layer 123. Note that the position of the light shielding film BM is not limited to the position on the planarization layer 123. For example, the light shielding film BM can be arranged between the optical elements 150 in the protective film 160, or on the protective film 160.

Figure 18:
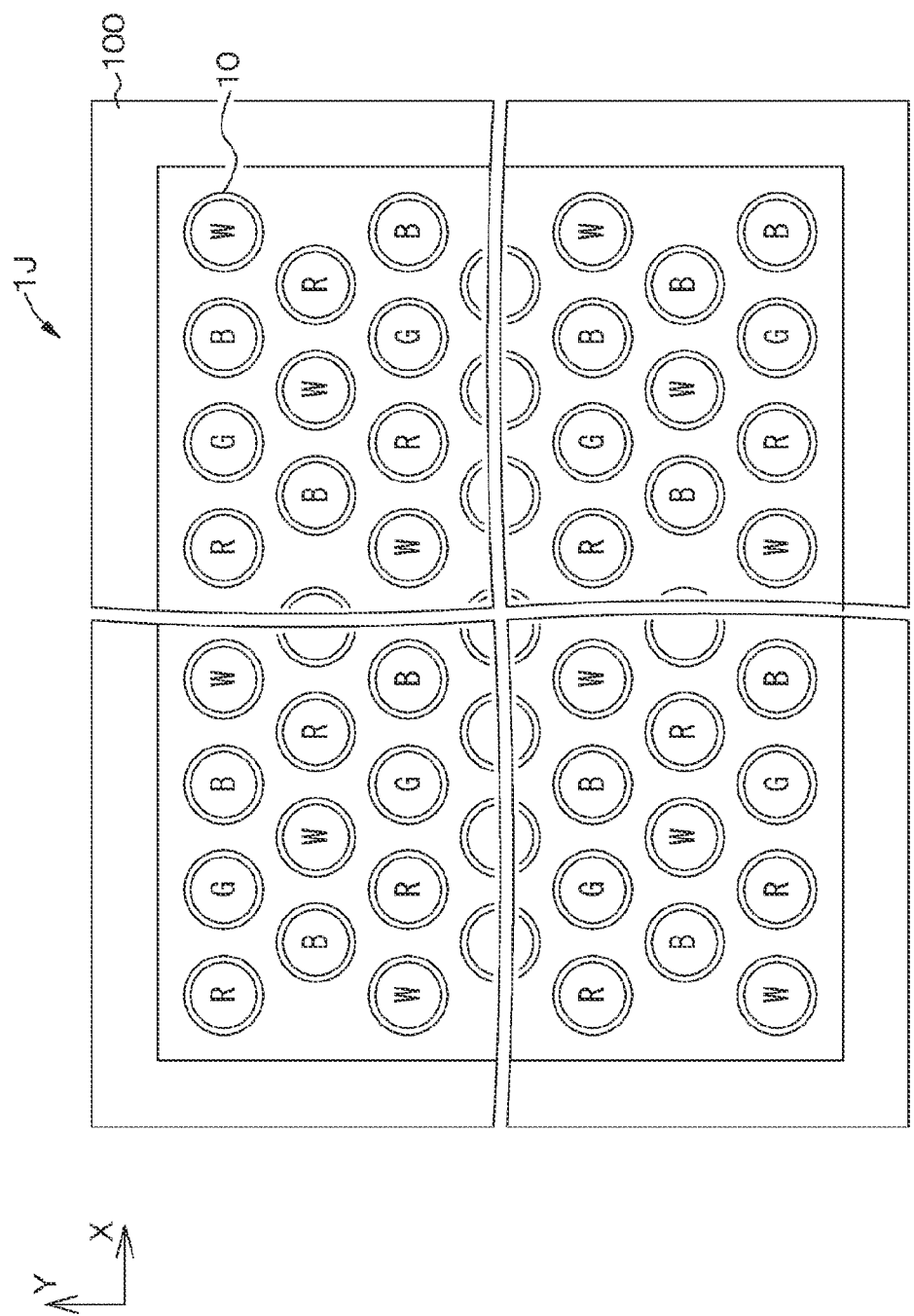
FIG. 18 is a schematic plan view for illustrating a light emitting device according to a ninth modification of the first embodiment.
Figure 19:
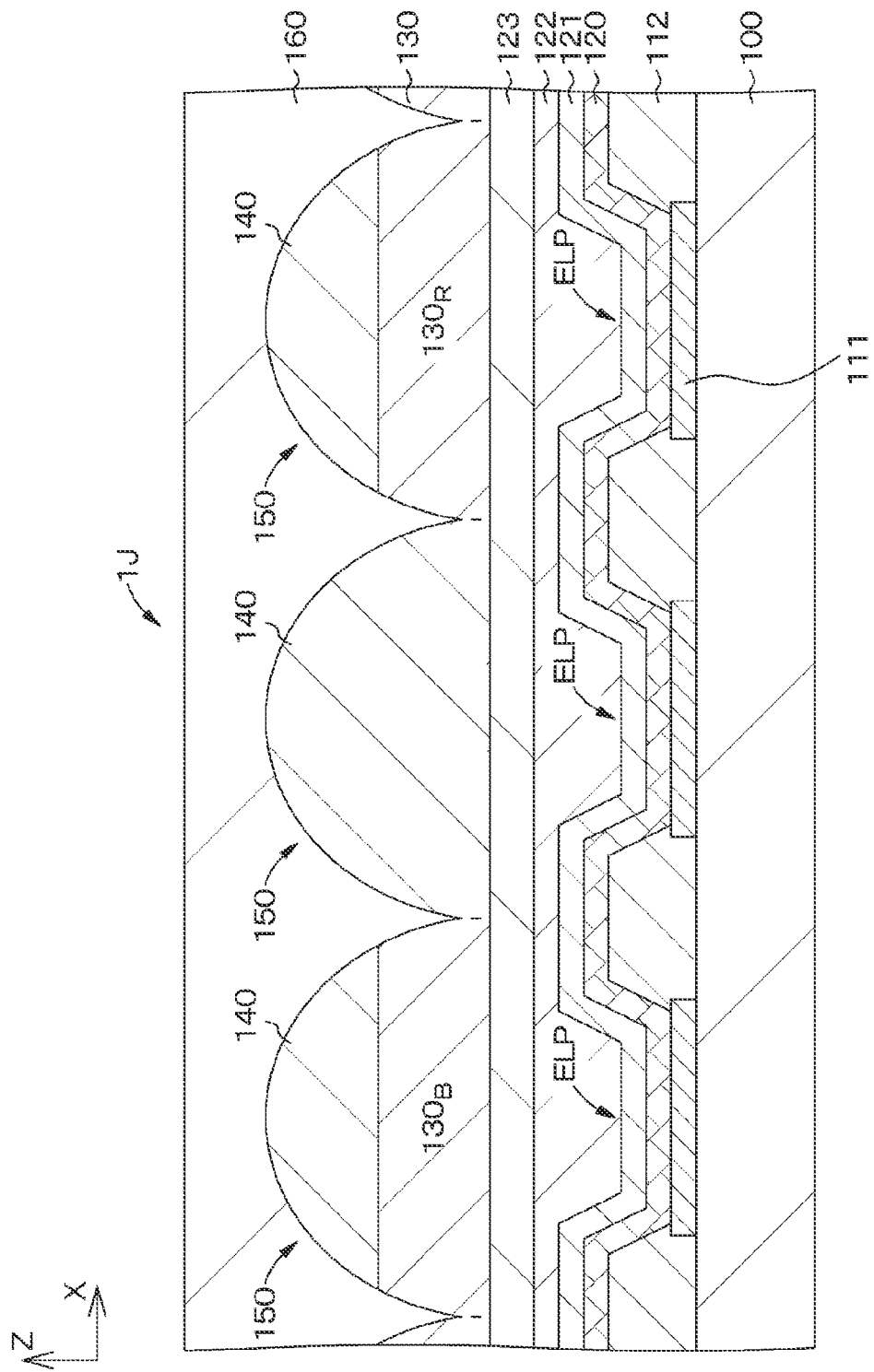
FIG. 19 is a schematic partial cross-sectional view of a substrate and the like for illustrating a light emitting device according to the ninth modification of the first embodiment.

FIG. 18 is a schematic plan view for illustrating a light emitting device according to a ninth modification of the first embodiment. Furthermore, FIG. 19 is a schematic partial cross-sectional view of a substrate and the like for illustrating the light emitting device according to the ninth modification of the first embodiment.

A light emitting device 1J according to the eighth modification further includes a light emitting element 150 entirely formed by the transparent layer 140. More specifically, as illustrated in FIG. 1, in the light emitting device 1J, besides the light emitting elements ELP corresponding to red display, blue display, and green display, a light emitting element ELP (denoted by a reference character W) corresponding to white display is arranged. Then, as illustrated in FIG. 19, the optical element 150 entirely formed by the transparent layer 140 is arranged on the light emitting element ELP corresponding to white display. The difference from the light emitting device 1 illustrated in FIG. 2 is as described above.

Second Embodiment

A second embodiment also relates to a light emitting device and an electronic device according to the present disclosure.

Figure 20:
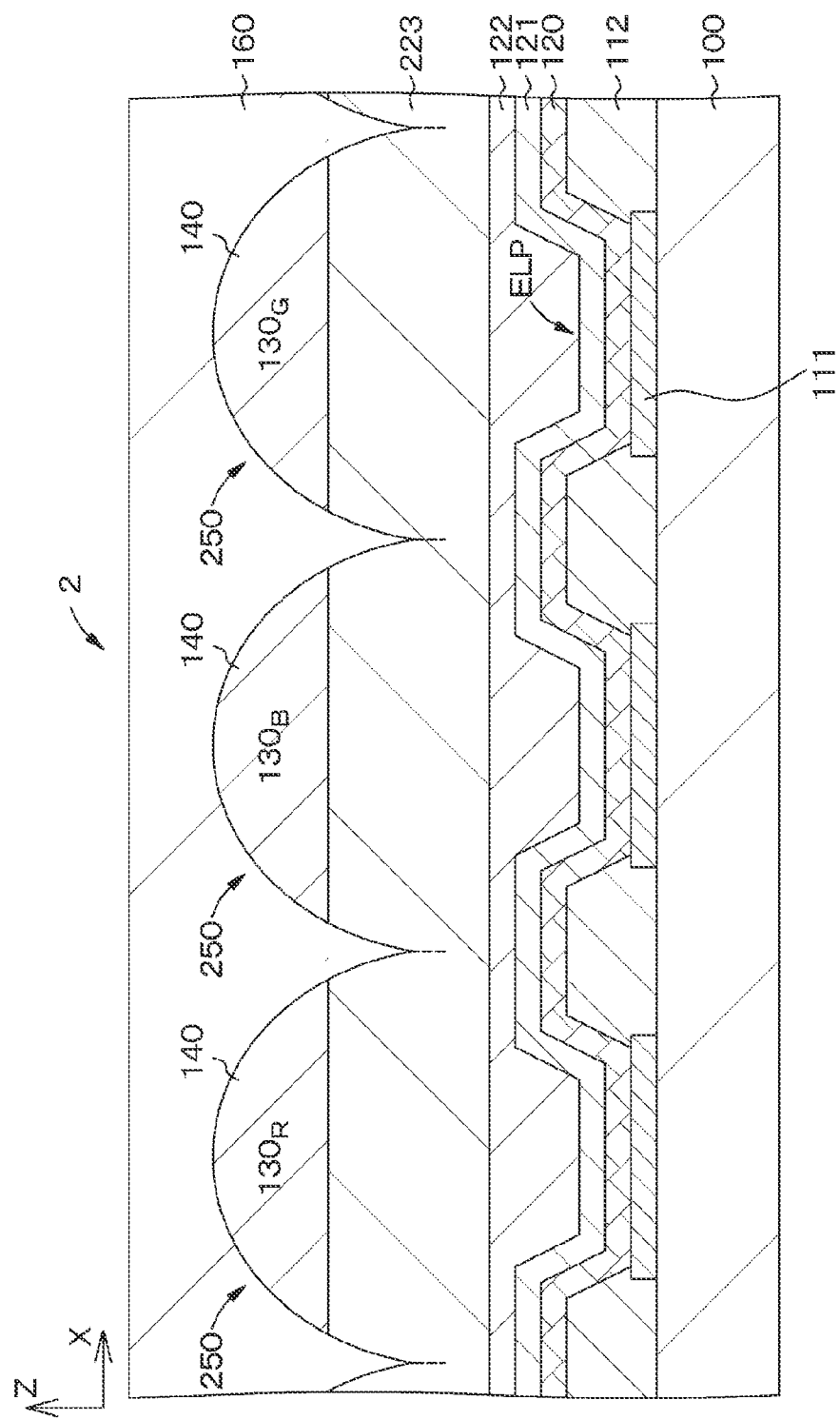
FIG. 20 is a schematic partial cross-sectional view of a substrate and the like for illustrating a light emitting device according to a second embodiment.

FIG. 20 is a schematic partial cross-sectional view of a substrate and the like for illustrating the light emitting device according to the second embodiment. A schematic plan view for illustrating the light emitting device according to the second embodiment may be obtained by using FIG. 1 with the light emitting device 1 replaced with a light emitting device 2.

The light emitting device 1 described in the first embodiment includes the optical elements 150 in which the color filter layer 130 is formed to constitute the lower layer portion on the incident side and the transparent layer 140 is formed to constitute the upper layer portion on the emanating side. On the other hand, the light emitting device 2 according to the second embodiment is different in that optical elements 250 are included in which a transparent layer 223 is formed to constitute a lower layer portion on the incident side and a color filter layer 130 is formed to constitute an upper layer portion on the emanating side. As illustrated in FIG. 20, the optical elements 250 have a convex lens shape in cross section. The interfaces between the upper layer portions and the lower layer portions of the optical elements 250 are planar.

The transparent layer 223 has a composition similar to that of the planarization layer 123 described in the first embodiment, but is different in that the transparent layer 223 is formed with a thickness sufficient to constitute a lower layer of the optical element 250. In the first embodiment, it is necessary to form the transparent layer 140 separately from the planarization layer 123 in order to form the optical elements 150. The light emitting device 2 has an advantage that it is not necessary to separately form a transparent layer 140 in order to form the optical element 250.

The transparent layer 223 constituting the lower layer portion has a portion that remains unexposed to the interface on a protective layer 122 side. A transparent protective film 160 is formed on the entire surface including the optical elements 250. The optical elements 250 are arranged in such a way that positional relationships between the centers of light emitting elements ELP and the centers of the optical elements 250 that correspond to each other are substantially coincident. The material constituting the protective film 160 may be appropriately selected in consideration of the characteristic related to adjustment of the direction of emanating light by the optical elements 250 and the like. Here, it is assumed that the protective film 160 is constituted by a material having a smaller refractive index than the material constituting the optical elements 250. The optical elements 250 adjust the direction of emanating light so as to collect light from the light emitting elements ELP.

Similarly to the first embodiment, in order to secure the lens power of the optical element 250, it is necessary to increase the thickness of the optical element 250 to some extent. The optical element 250 has a configuration in which the transparent layer 223 and the color filter layer 130 are laminated, and this structure facilitates securing of the thickness. Also in this structure, the thickness of the color filter layer 130 can be determined with emphasis on the characteristic related to efficient extraction of light of a predetermined wavelength, and the thickness of the transparent layer 223 can be determined with emphasis on the characteristic related to adjustment of the direction of emanating light. It is therefore an object of the present disclosure to achieve a suitable balance between the characteristic related to adjustment of the direction of emanating light and the characteristic related to efficient extraction of light of a predetermined wavelength.

Note that, although the optical element 250 has a convex lens shape on the light emanating side in the drawings, this is an example, and it is sufficient if the optical element has a function of adjusting the direction of emanating light as illustrated in the present example. Similarly to the description of FIGS. 4A, 4B, 4C, 4D, 4E, 5A, 5B, 5C, 5D, and 5E in the first embodiment, the optical element 250 cut along a plane orthogonal to the light emitting region may have a cross-sectional shape that is any one of a circular shape, a trapezoidal shape, a rectangular shape, and a polygonal shape, or a shape obtained by combining any of these shapes.

The structure of the light emitting device 2 has been described above. The description will be followed by a description of a method of manufacturing the light emitting device 2 according to the second embodiment.

FIGS. 21 to 24 are schematic partial cross-sectional views of a substrate and the like for illustrating the method of manufacturing the light emitting device according to the first embodiment.

Figure 21:
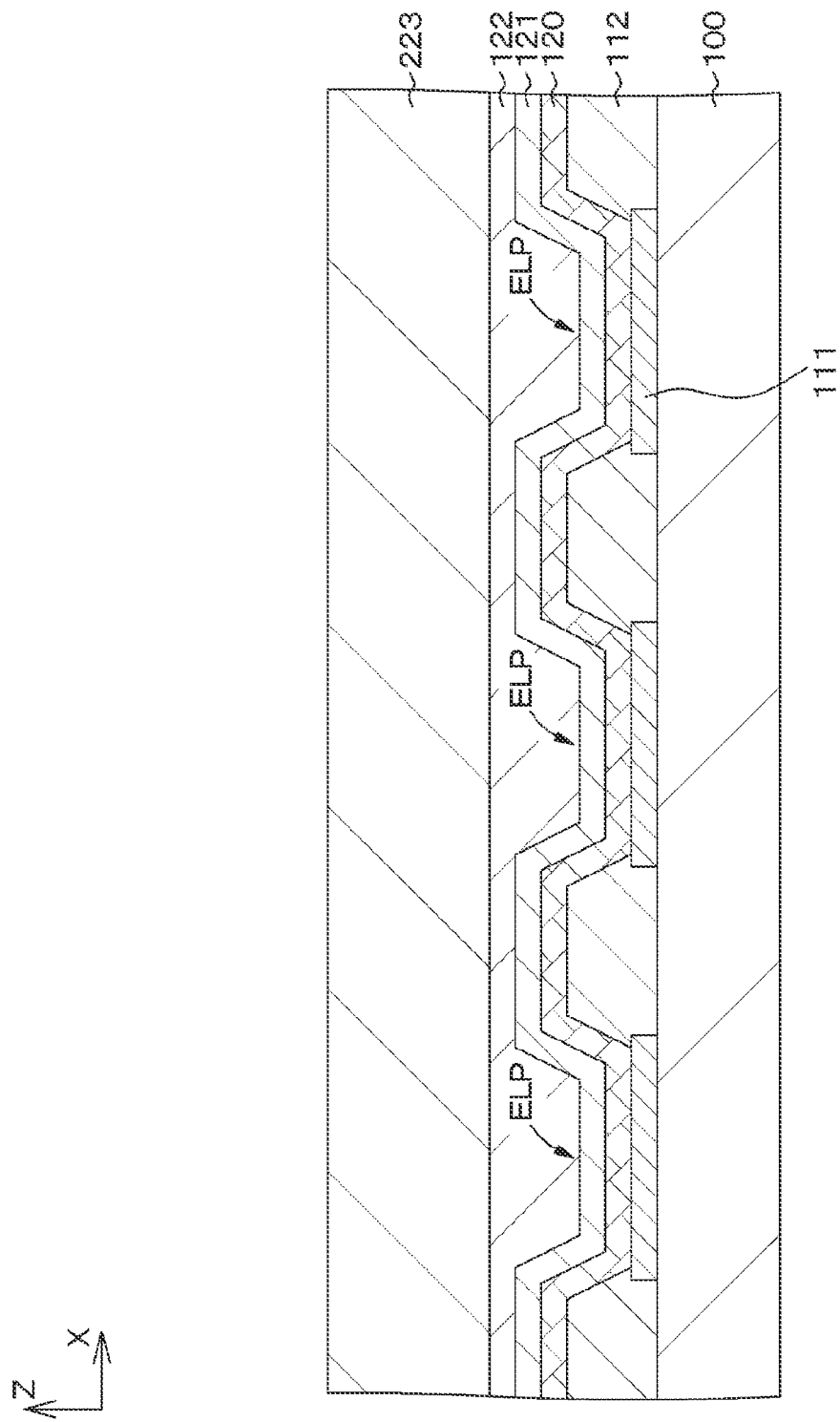
FIG. 21 is a schematic partial cross-sectional view of a substrate and the like for illustrating a method of manufacturing the light emitting device according to the second embodiment.

[Step-200] (See FIG. 21)

A step similar to [Step-100] described in the first embodiment is performed, and thus a light emitting region LP constituted by the light emitting elements ELP arranged in a matrix is formed on a substrate 100. Specifically, first electrodes 111 corresponding to the light emitting elements ELP are formed on the substrate 100. Next, an organic layer 120 including a light emitting layer, a second electrode 121, the protective layer 122, and the transparent layer 223 are sequentially formed.

Figure 22:
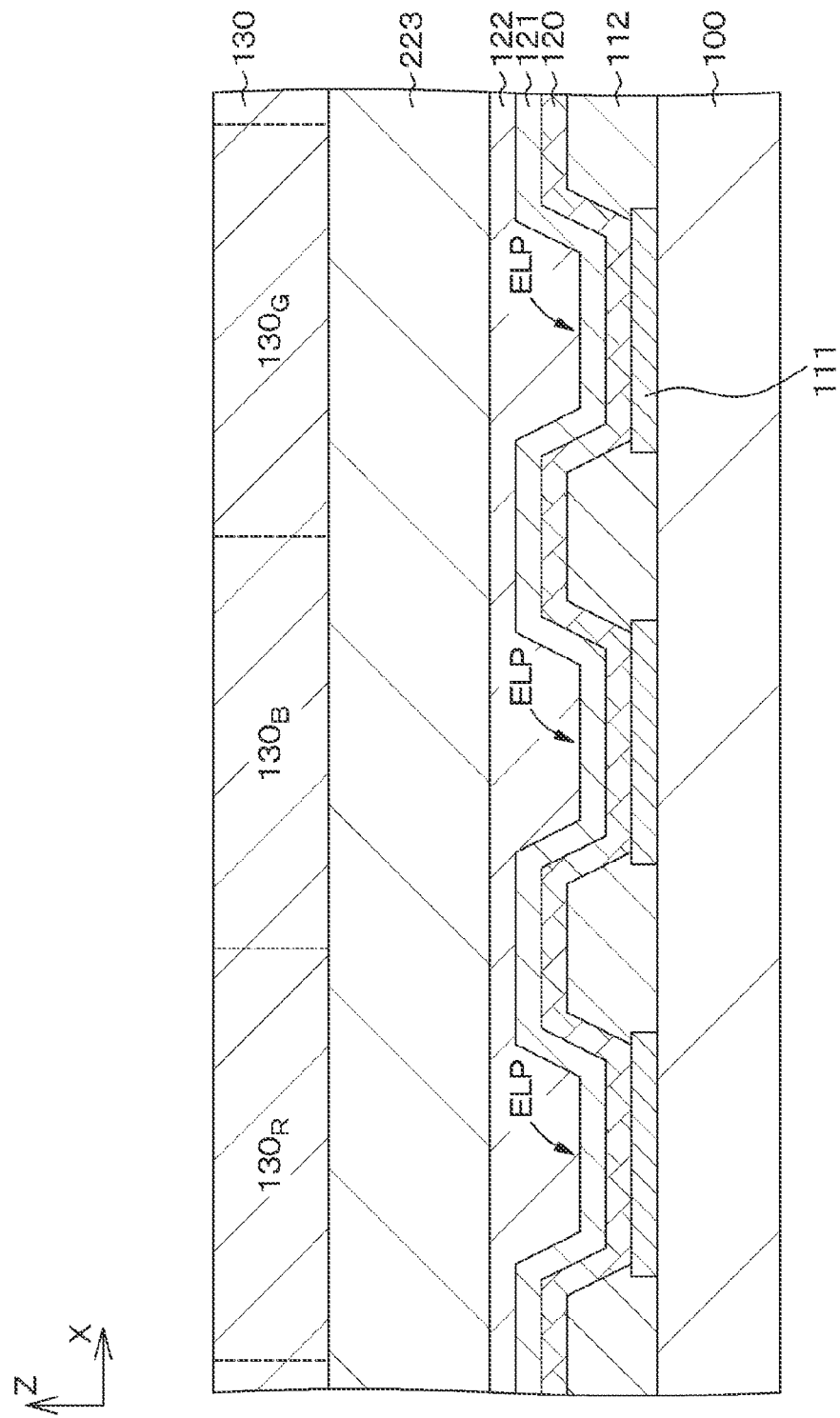
FIG. 22 is a schematic partial cross-sectional view of a substrate and the like for illustrating the method of manufacturing the light emitting device according to the second embodiment, following FIG. 21.
Figure 23:
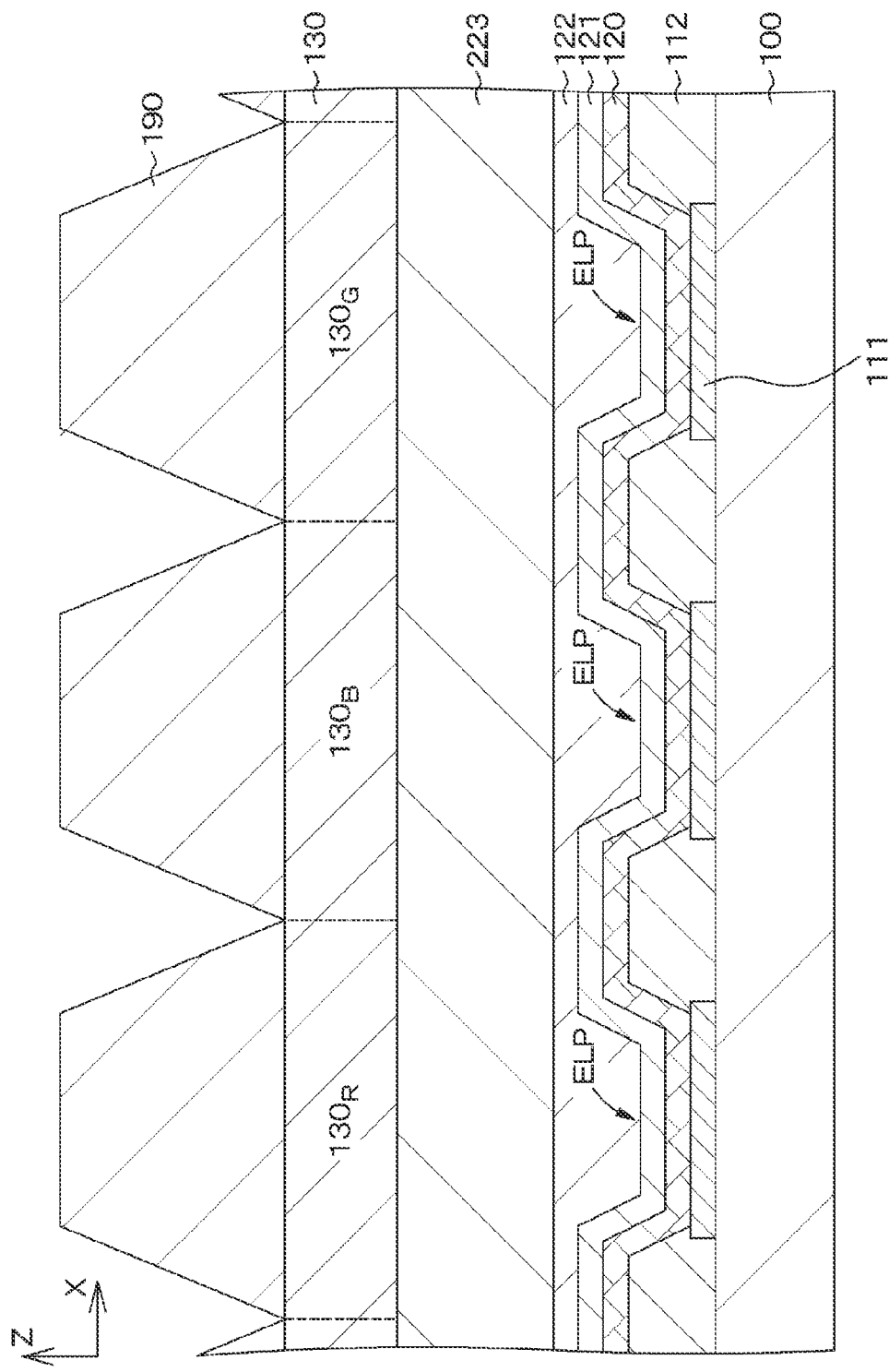
FIG. 23 is a schematic partial cross-sectional view of a substrate and the like for illustrating the method of manufacturing the light emitting device according to the second embodiment, following FIG. 22.
Figure 24:
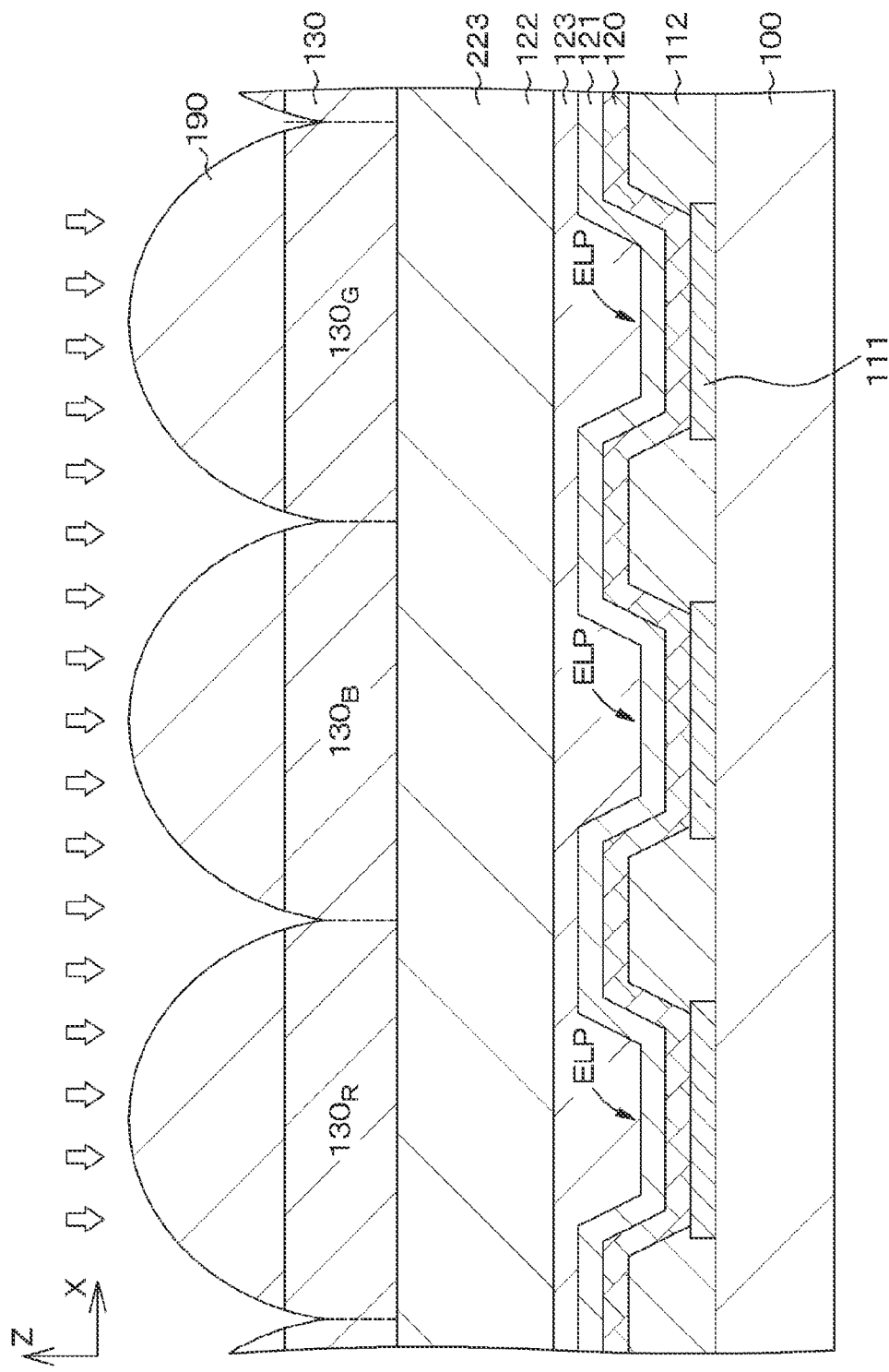
FIG. 24 is a schematic partial cross-sectional view of a substrate and the like for illustrating the method of manufacturing the light emitting device according to the second embodiment, following FIG. 23.

[Step-210] (See FIGS. 22, 23, and 24)

Next, the optical elements 250 corresponding to the light emitting elements ELP are formed. First, the color filter layer 130 is formed on the transparent layer 223 by a known method (see FIG. 22). Next, a resist 190 for forming optical elements is formed on the color filter layer 130. For example, the resist 190 on a trapezoid is formed (see FIG. 22).

Thereafter, for example, dry etching processing is performed so that the resist 190, the color filter layer 130, and the transparent layer 223 are etched. FIG. 24 schematically illustrates a state during the etching processing. The thicker the resist 190, the less the base is etched. Thus, the optical elements 250 in which the upper layer portion is constituted by the color filter layer 130 and the lower layer portion is constituted by the transparent layer 223 are formed.

[Step-220]

Thereafter, the protective film 160 is formed on the entire surface including the optical elements 250. The light emitting device 2 can be obtained by the steps described above. Note that a transparent counter substrate may be arranged on the protective film 160 as necessary.

The method of manufacturing the light emitting device 2 has been described above.

Note that the contents of the various modifications described in the first embodiment can also be applied to the second embodiment as long as there is no hindrance in implementation.

Third Embodiment

A third embodiment also relates to a light emitting device and an electronic device according to the present disclosure.

In the above-described first embodiment and second embodiment, the optical elements 150 and 250 are arranged in such a way that the positional relationships between the centers of the light emitting elements and the centers of the optical elements that correspond to each other are substantially coincident. On the other hand, in the third embodiment, the optical elements have a configuration in which there is a deviation between the centers of the light emitting elements and the centers of the optical elements that correspond to each other.

Figure 25:
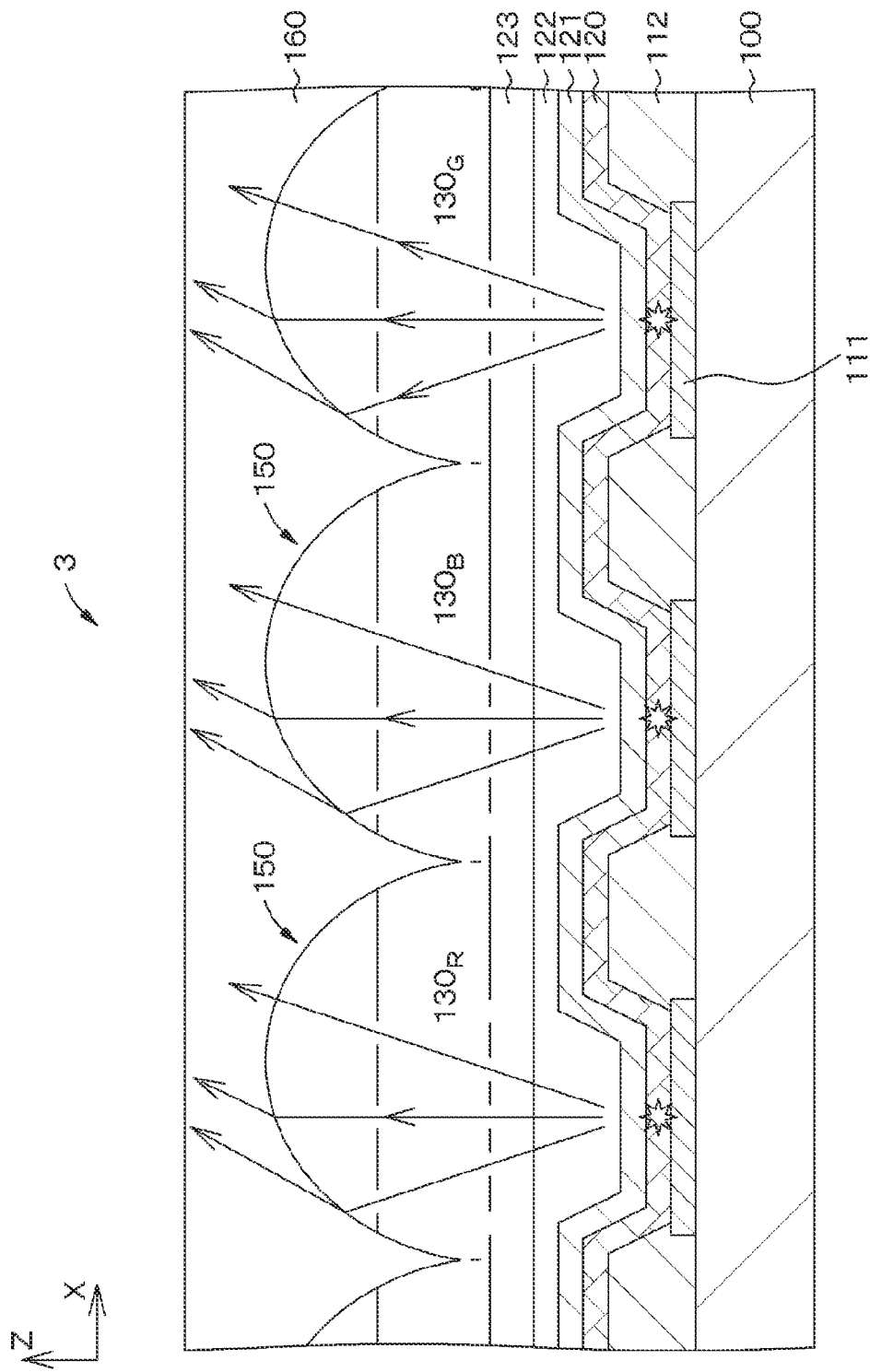
FIG. 25 is a schematic partial cross-sectional view of a substrate and the like for illustrating a light emitting device according to a third embodiment.

FIG. 25 is a schematic partial cross-sectional view of a substrate and the like for illustrating the light emitting device according to the third embodiment. More specifically, a light emitting device 3 has a configuration obtained by providing, to the light emitting device 1 in the first embodiment, a deviation between the centers of the optical elements 150 and the centers of the light emitting elements ELP that correspond to each other. Note that, although illustration is omitted, the configuration may be obtained by providing, to the light emitting device 2 described in the second embodiment, a deviation between the centers of the optical elements 250 and the centers of the light emitting elements ELP that correspond to each other.

As illustrated in the drawing, the direction of light collection changes in accordance with the deviation between the center of the optical element and the center of the corresponding light emitting element. The optical elements may be arranged in such a way that the positional relationships between the centers of the light emitting elements and the centers of the optical elements that correspond to each other have a predetermined deviation amount, or may be arranged in such a way that the positional relationships between the centers of the light emitting elements and the centers of the optical elements have a deviation amount that changes in accordance with the positions of the light emitting elements in the light emitting region.

For example, in a case where it is necessary to set different light collection directions for a light emitting device for a right eye and a light emitting device for a left eye, the light emitting elements of the light emitting device for the right eye and the light emitting elements of the light emitting device for the left eye may be arranged in such a way that the positional relationships between the centers of the light emitting elements and the centers of the optical elements that correspond to each other have a predetermined deviation amount. Alternatively, in a case where a condition related to the positional relationship between the light emitting device and an observer greatly differs between a central portion and a peripheral portion of the light emitting region, the optical elements may be arranged in such a way that the positional relationships between the centers of the light emitting elements and the centers of the optical elements have a deviation amount that changes in accordance with the positions of the light emitting elements in the light emitting region.

Fourth Embodiment

A fourth embodiment also relates to a light emitting device and an electronic device according to the present disclosure.

Figure 26:
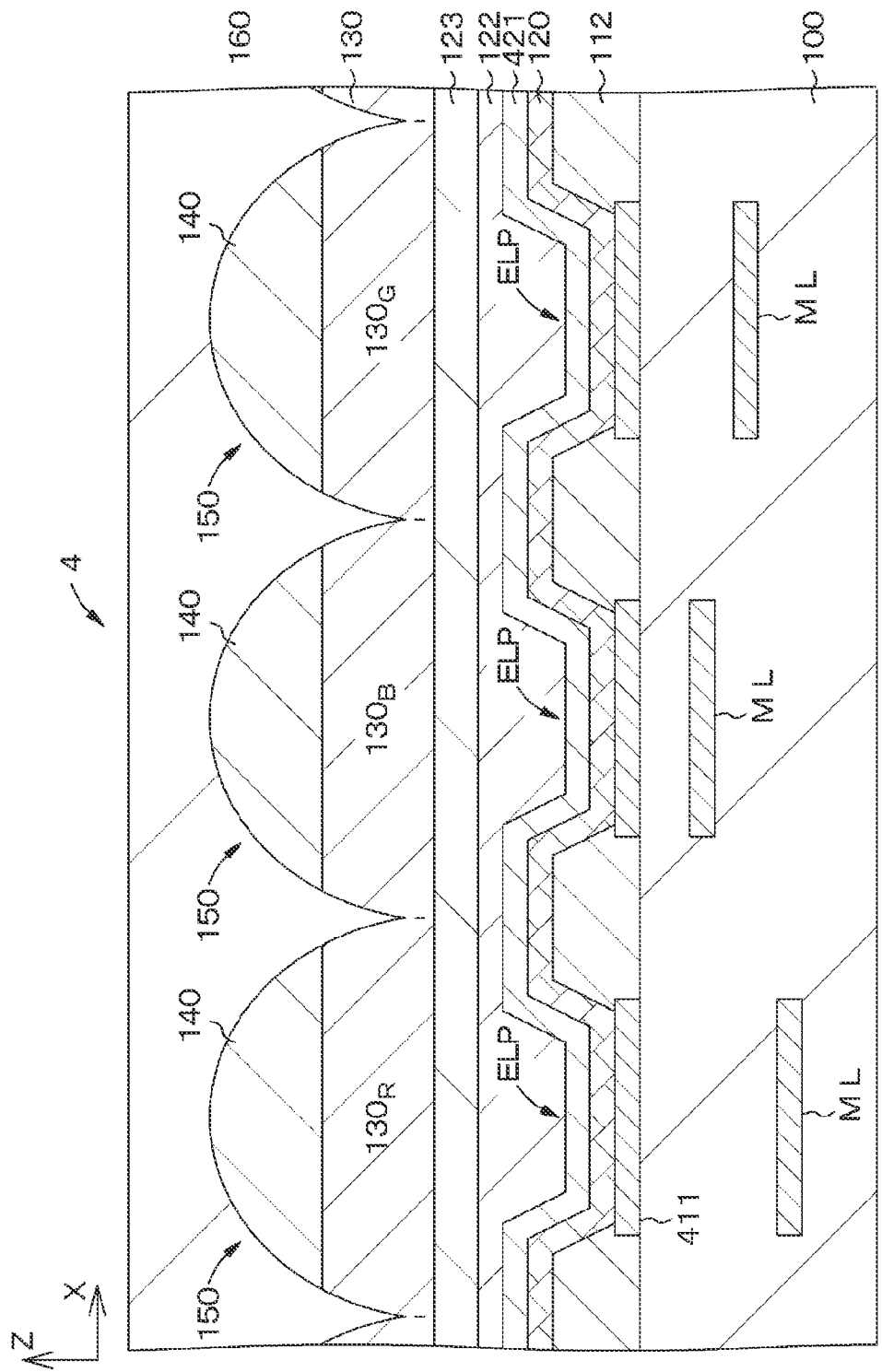
FIG. 26 is a schematic partial cross-sectional view of a substrate and the like for illustrating a light emitting device according to a fourth embodiment.

FIG. 26 is a schematic partial cross-sectional view of a substrate and the like for illustrating the light emitting device according to the fourth embodiment. A schematic plan view for illustrating the light emitting device according to the fourth embodiment may be obtained by using FIG. 1 with the light emitting device 1 replaced with a light emitting device 4.

The light emitting devices according to the above-described embodiments may have a configuration in which the light emitting elements have a resonator structure that resonates light. The light emitting device 4 basically has a configuration in which a resonator structure is added to the light emitting device 1 in the first embodiment. Note that, although illustration is omitted, it is possible to adopt a configuration in which a resonator structure is added to the light emitting device 2 described in the second embodiment.

Hereinafter, the resonator structure will be described with reference to a drawing.

In the example illustrated in FIG. 26, a reflector ML is arranged in a substrate 100. The reflector ML can be formed with the use of, for example, a metal such as aluminum (Al), silver (Ag), or copper (Cu), or an alloy containing any of these metals as main components. A first electrode 411 is constituted by a transparent conductive material layer, and a second electrode 421 is constituted by a semi-transmissive conductive material. A resonator structure is formed in accordance with the distance between the reflector ML and the second electrode 421.

For example, in a light emitting element ELP in which a red color filter layer 130R is arranged, the reflector ML is arranged so as to satisfy a resonance condition for light having a red wavelength. In a light emitting element ELP in which a blue color filter layer $130_B$ is arranged, the reflector ML is arranged so as to satisfy a resonance condition for light having a blue wavelength. Similarly, in a light emitting element ELP in which a green color filter layer $130_G$ is arranged, the reflector ML is arranged so as to satisfy a resonance condition for light having a green wavelength. White light from an organic layer 120 is extracted with light of a predetermined wavelength emphasized by the resonator structure between the reflector ML and the second electrode 421. With this arrangement, light emitting efficiency can be improved.

[Description of Electronic Device]

The light emitting device of the present disclosure described above can be used as a display unit (light emitting device) of an electronic device in any field that displays, as an image or a video, a video signal input to the electronic device or a video signal generated in the electronic device. As an example, the light emitting device can be used as a display unit of, for example, a television set, a digital still camera, a notebook personal computer, a mobile terminal device such as a mobile phone, a video camera, or a head mounted display (display to be worn on the head).

The light emitting device of the present disclosure also includes a module-shaped light emitting device having a sealed configuration. Note that the display module may be provided with a circuit unit, a flexible printed circuit (FPC), or the like for inputting and outputting a signal or the like from the outside to the light emitting region. Hereinafter, a digital still camera and a head mounted display will be exemplified as specific examples of an electronic device that uses the light emitting device of the present disclosure. However, the specific examples exemplified here are merely examples, and are not restrictive.

Figure 27A:
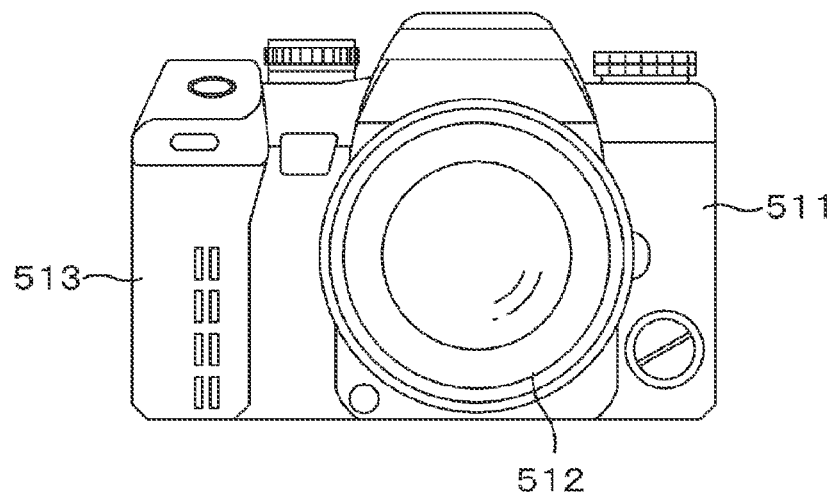
Figure 27B:
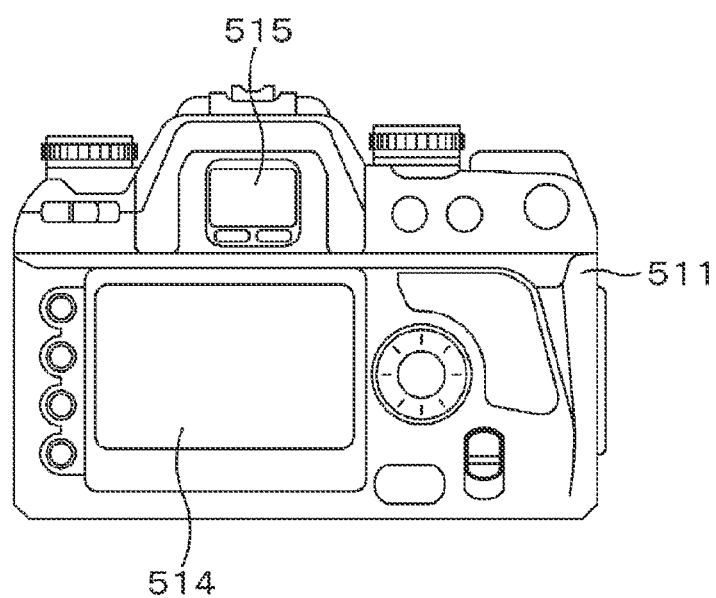

(First specific example) FIGS. 27A and 27B are external views of a single-lens reflex digital still camera with interchangeable lenses, in which FIG. 27A illustrates a front view thereof and FIG. 27B illustrates a rear view thereof. The single-lens reflex digital still camera with interchangeable lenses has, for example, an interchangeable imaging lens unit (interchangeable lens) 512 on the front right side of a camera main body (camera body) 511, and a grip portion 513 for a photographer to grip on the front left side.

Then, a monitor 514 is provided substantially at the center on the back of the camera main body 511. A viewfinder (eyepiece window) 515 is provided above the monitor 514.

By looking into the viewfinder 515, the photographer can see an optical image of a subject guided from the imaging lens unit 512 and determine a composition.

The light emitting device of the present disclosure can be used as the viewfinder 515 in the single-lens reflex digital still camera with interchangeable lenses having the configuration described above. That is, the single-lens reflex digital still camera with interchangeable lenses according to the present example is fabricated with the use of the light emitting device of the present disclosure as the viewfinder 515.

Second Specific Example

Figure 28:
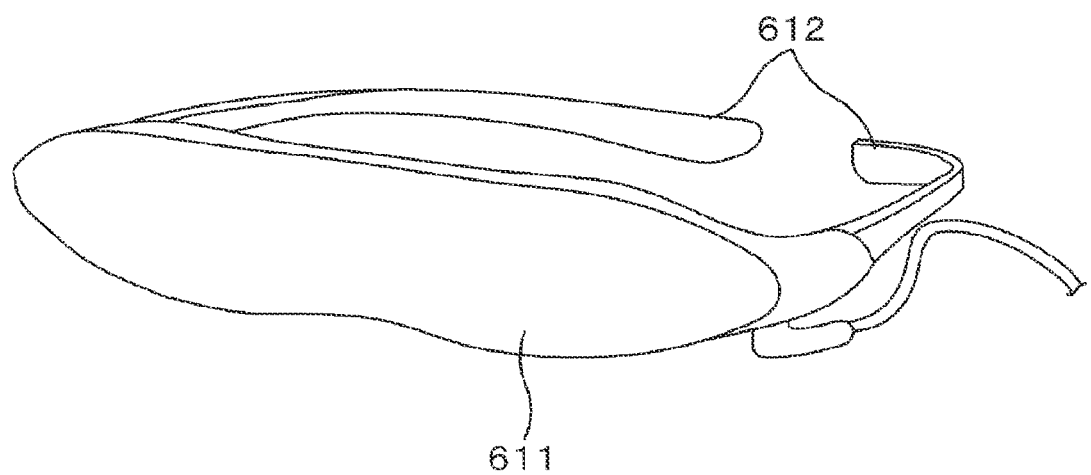
FIG. 28 is an external view of a head mounted display.

FIG. 28 is an external view of a head mounted display. The head mounted display has, for example, ear hook portions 612 for mounting the head mounted display on a user's head, on both sides of a glasses-shaped display unit 611. The light emitting device of the present disclosure can be used as the display unit 611 in the head mounted display. That is, the head mounted display according to the present example is fabricated with the use of the light emitting device of the present disclosure as the display unit 611.

Third Specific Example

Figure 29:
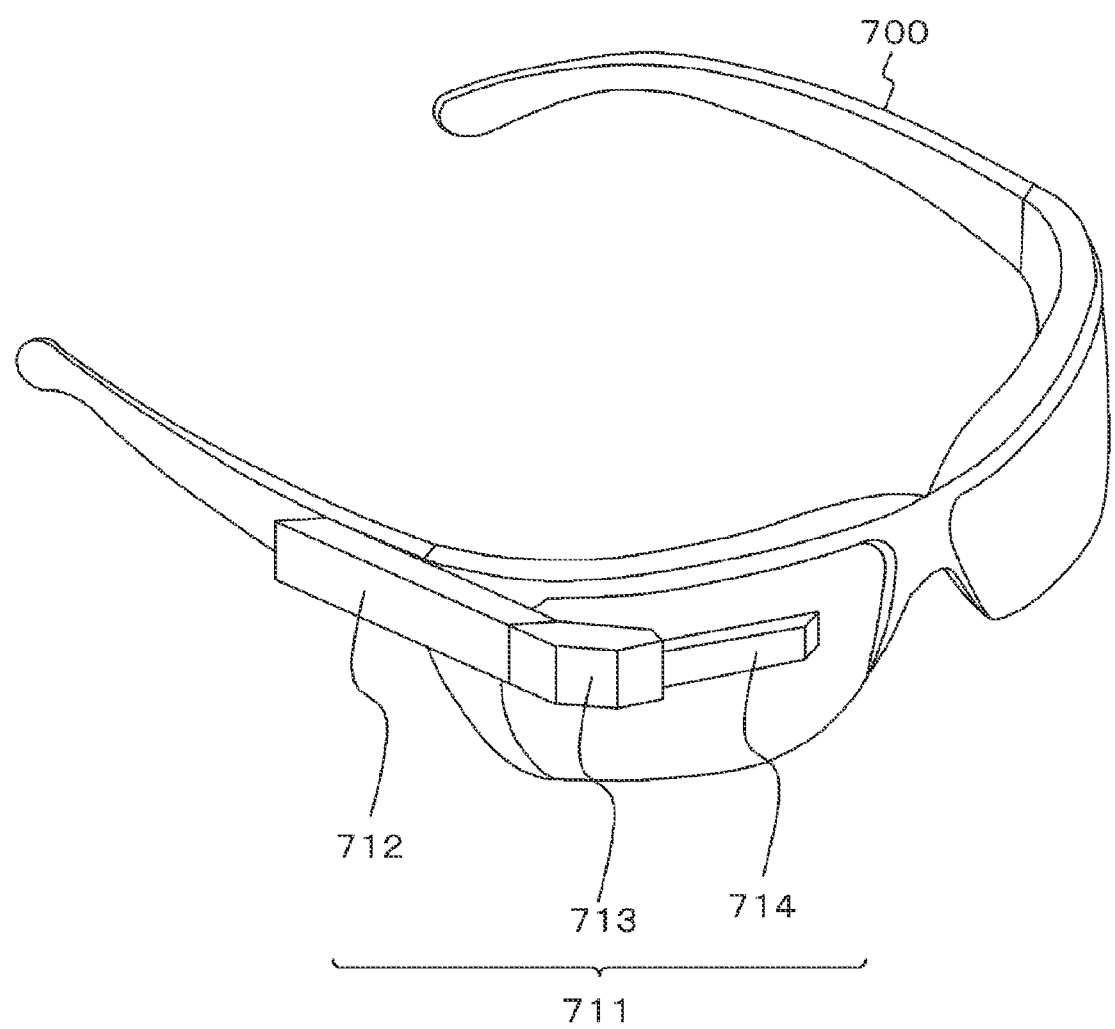
FIG. 29 is an external view of a see-through head mounted display.

FIG. 29 is an external view of a see-through head mounted display. A see-through head mounted display 711 is constituted by a main body 712, an arm 713, and a lens barrel 714.

The main body 712 is connected to the arm 713 and glasses 700. Specifically, an end of the main body 712 in a long side direction is coupled to the arm 713, and one side surface of the main body 712 is coupled to the glasses 700 via a connecting member. Note that the main body 712 may be directly mounted on a head of a human body.

The main body 712 incorporates a display unit and a control board for controlling the operation of the see-through head mounted display 711. The arm 713 connects the main body 712 and the lens barrel 714, and supports the lens barrel 714. Specifically, the arm 713 is coupled to an end of the main body 712 and an end of the lens barrel 714, and fixes the lens barrel 714. Furthermore, the arm 713 incorporates a signal line for communication of data related to an image to be provided from the main body 712 to the lens barrel 714.

The lens barrel 714 projects image light provided from the main body 712 via the arm 713 toward eyes of a user wearing the see-through head mounted display 711 through eyepiece lenses. The light emitting device of the present disclosure can be used for the display unit of the main body 712 in the see-through head mounted display 711.

Note that the effects described herein are merely illustrative and are not intended to be restrictive, and other effects may be obtained.

[Others]

Note that the technology of the present disclosure can also be configured as described below.

[A1]

A light emitting device including:
a light emitting region constituted by light emitting elements arranged in a matrix,
in which optical elements are included as optical elements formed in such a way as to correspond to the light emitting elements and configured to adjust a direction of emanating light, the optical elements being formed in such a way that one of a color filter layer and a transparent layer is formed to constitute a lower layer portion on an incident side and another is formed to constitute an upper layer portion on an emanating side, and the upper layer portion and at least a part of the lower layer portion are formed to be exposed to an interface with an outside.

[A2]

The light emitting device according to [A1], including:
the optical elements in which the color filter layer is formed to constitute the lower layer portion on the incident side and the transparent layer is formed to constitute the upper layer portion on the emanating side.

[A3]

The light emitting device according to [A2], in which color filter layers of different types are formed in such a way as to be laminated in a region between each of the optical elements adjacent to each other.

[A4]

The light emitting device according to [A1], including:
the optical elements in which the transparent layer is formed to constitute the lower layer portion on the incident side and the color filter layer is formed to constitute the upper layer portion on the emanating side.

[A5]

The light emitting device according to any one of [A1] to [A4], in which
the optical elements have a planar or curved interface between the upper layer portion and the lower layer portion.

[A6]

The light emitting device according to any one of [A1] to [A5], further including:
an optical element entirely formed by a color filter layer or a transparent layer.

[A7]

The light emitting device according to any one of [A1] to [A6], in which
the color filter layer includes fine particles constituting a coloring material and/or quantum dots.

[A8]

The light emitting device according to any one of [A1] to [A7], in which
a transparent protective film is formed on an entire surface including the optical elements.

[A9]

The light emitting device according to [A8], in which
the protective film is formed by a material having a refractive index different from a refractive index of a material constituting the optical elements.

[A10]

The light emitting device according to any one of [A1] to [A9], in which
the optical elements cut along a plane orthogonal to the light emitting region have a cross-sectional shape that is any one of a circular shape, a trapezoidal shape, a rectangular shape, and a polygonal shape, or a shape obtained by combining any of these shapes.

[A11]

The light emitting device according to any one of [A1] to [A10], in which
a light shielding layer is formed between each of the light emitting elements adjacent to each other.

[A12]

The light emitting device according to any one of [A1] to [A11], in which
the optical elements are arranged in such a way that positional relationships between centers of the light emitting elements and centers of the optical elements that correspond to each other are substantially coincident.

[A13]

The light emitting device according to any one of [A1] to [A11], in which
the optical elements are arranged in such a way that positional relationships between centers of the light emitting elements and centers of the optical elements that correspond to each other have a predetermined deviation amount.

[A14]

The light emitting device according to any one of [A1] to [A11], in which
the optical elements are arranged in such a way that positional relationships between centers of the light emitting elements and centers of the optical elements have a deviation amount that changes in accordance with positions of the light emitting elements in the light emitting region.

[A15]

The light emitting device according to any one of [A1] to [A14], in which
the light emitting elements are constituted by organic electroluminescence elements.

[A16]

The light emitting device according to [A15], in which
the light emitting elements have a resonator structure that resonates light.

[B1]

An electronic device including a light emitting device including:
a light emitting region constituted by light emitting elements arranged in a matrix,
in which optical elements are included as optical elements formed in such a way as to correspond to the light emitting elements and configured to adjust a direction of emanating light, the optical elements being formed in such a way that one of a color filter layer and a transparent layer is formed to constitute a lower layer portion on an incident side and another is formed to constitute an upper layer portion on an emanating side, and the upper layer portion and at least a part of the lower layer portion are formed to be exposed to an interface with an outside.

[B2]

The electronic device according to [B1], including:
the optical elements in which the color filter layer is formed to constitute the lower layer portion on the incident side and the transparent layer is formed to constitute the upper layer portion on the emanating side.

[B3]

The electronic device according to [B2], in which
color filter layers of different types are formed in such a way as to be laminated in a region between each of the optical elements adjacent to each other.

[B4]

The electronic device according to [B1], including:
the optical elements in which the transparent layer is formed to constitute the lower layer portion on the incident side and the color filter layer is formed to constitute the upper layer portion on the emanating side.

[B5]

The electronic device according to any one of [B1] to [B4], in which
the optical elements have a planar or curved interface between the upper layer portion and the lower layer portion.

[B6]

The electronic device according to any one of [B1] to [B5], further including:
an optical element entirely formed by a color filter layer or a transparent layer.

[B7]

The electronic device according to any one of [B1] to [B6], in which
the color filter layer includes fine particles constituting a coloring material and/or quantum dots.

[B8]

The electronic device according to any one of [B1] to [B7], in which
a transparent protective film is formed on an entire surface including the optical elements.

[B9]

The electronic device according to [B8], in which
the protective film is formed by a material having a refractive index different from a refractive index of a material constituting the optical elements.

[B10]

The electronic device according to any one of [B1] to [B9], in which
the optical elements cut along a plane orthogonal to the light emitting region have a cross-sectional shape that is any one of a circular shape, a trapezoidal shape, a rectangular shape, and a polygonal shape, or a shape obtained by combining any of these shapes.

[B11]

The electronic device according to any one of [B1] to [B10], in which
a light shielding layer is formed between each of the light emitting elements adjacent to each other.

[B12]

The electronic device according to any one of [B1] to [B11], in which
the optical elements are arranged in such a way that positional relationships between centers of the light emitting elements and centers of the optical elements that correspond to each other are substantially coincident.

[B13]

The electronic device according to any one of [B1] to [B11], in which
the optical elements are arranged in such a way that positional relationships between centers of the light emitting elements and centers of the optical elements that correspond to each other have a predetermined deviation amount.

[B14]

The electronic device according to any one of [B1] to [B11], in which
the optical elements are arranged in such a way that positional relationships between centers of the light emitting elements and centers of the optical elements have a deviation amount that changes in accordance with positions of the light emitting elements in the light emitting region.

[B15]

The electronic device according to any one of [B1] to [B14], in which
the light emitting elements are constituted by organic electroluminescence elements.

[B16]

The electronic device according to [B15], in which
the light emitting elements have a resonator structure that resonates light.

REFERENCE SIGNS LIST 1, 1A, 1B, 1C, 1D, 1E, 1F, 1G, 1H, 1J, 2, 3, 4 Light emitting device
100 Substrate
111 First electrode
112 Partition wall
121 Second electrode
122 Protective layer
123 Planarization layer
130, $130_R$, $130_B$, $130_G$ Color filter layer
140 Transparent layer
150 Optical element
160 Protective film
190 Resist
223 Transparent layer
411 First electrode
421 Second electrode
511 Camera main body
512 Imaging lens unit
513 Grip portion
514 Monitor
515 Viewfinder
611 Glasses-shaped display unit
612 Ear hook portion
700 Glasses
711 See-through head mounted display
712 Main body
713 Arm
714 Lens barrel
LP Light emitting region
ELP Light emitting element
DP Region between adjacent optical elements
BM Light shielding layer
ML Reflective film

The invention claimed is:

1. A light emitting device, comprising:
a light emitting region that includes:
a plurality of light emitting elements in a matrix arrangement; and
a plurality of first optical elements, wherein
each first optical element of the plurality of first optical elements is associated with a respective light emitting element of the plurality of light emitting elements,
the plurality of first optical elements is configured to adjust a direction of emanating light,
the plurality of first optical elements includes:
a lower layer portion that includes a color filter layer; and
an upper layer portion that includes a transparent layer,
the lower layer portion is on an incident side of the plurality of first optical elements,
the upper layer portion is on an emanating side of the plurality of first optical elements,
the color filter layer includes a concave curved surface at an interface between the upper layer portion and the lower layer portion, and
the plurality of first optical elements exposes the upper layer portion and at least a part of the lower layer portion to interface with an outside of the light emitting device.

2. The light emitting device according to claim 1, further comprising a plurality of color filter layers of a plurality of different types, wherein
the plurality of color filter layers is laminated in a region between a first light emitting element of the plurality of light emitting elements and a second light emitting element of the plurality of light emitting elements,
the second light emitting element is adjacent to the first light emitting element, and
the plurality of color filter layers includes the color filter layer.

3. The light emitting device according to claim 1, further comprising a second optical element different from the plurality of first optical elements, wherein the second optical element entirely includes one of the color filter layer or the transparent layer.

4. The light emitting device according to claim 1, wherein the color filter layer further includes fine particles constituting at least one of a coloring material or quantum dots.

5. The light emitting device according to claim 1, further comprising a transparent protective film on an entire surface of the plurality of first optical elements.

6. The light emitting device according to claim 5, wherein
the plurality of first optical elements further includes a first material, and
the transparent protective film includes a second material having a refractive index different from a refractive index of the first material.

7. The light emitting device according to claim 1, wherein, in a case where the plurality of first optical elements is cut along a plane orthogonal to the light emitting region, the plurality of first optical elements has a cross-sectional shape that is at least one of a circular shape, a trapezoidal shape, a rectangular shape, or a polygonal shape.

8. The light emitting device according to claim 1, further comprising a light shielding layer between a first light emitting element of the plurality of light emitting elements and a second light emitting element of the plurality of light emitting elements, wherein the second light emitting element is adjacent to the first light emitting element.

9. The light emitting device according to claim 1, wherein
the plurality of first optical elements is in a specific arrangement, and
in the specific arrangement, positional relationships between centers of the plurality of light emitting elements and centers of the plurality of first optical elements are substantially coincident.

10. The light emitting device according to claim 1, wherein
the plurality of first optical elements is in a specific arrangement, and
in the specific arrangement, positional relationships between centers of the plurality of light emitting elements and centers of the plurality of first optical elements have a deviation amount.

11. The light emitting device according to claim 1, wherein
the plurality of first optical elements is in a specific arrangement, in the specific arrangement, positional relationships between centers of the plurality of light emitting elements and centers of the plurality of first optical elements have a deviation amount, and the deviation amount changes based on positions of the plurality of light emitting elements in the light emitting region.

12. The light emitting device according to claim 1, wherein the plurality of light emitting elements includes a plurality of organic electroluminescence elements.

13. The light emitting device according to claim 12, wherein the plurality of light emitting elements have a resonator structure configured to resonate light.

14. An electronic device, comprising:
 a light emitting device including:
  a light emitting region that includes:
   a plurality of light emitting elements in a matrix arrangement; and
   a plurality of optical elements, wherein
    each optical element of the plurality of optical elements is associated with a respective light emitting element of the plurality of light emitting elements,
    the plurality of optical elements is configured to adjust a direction of emanating light,
    the plurality of optical elements includes:
     a lower layer portion that includes a color filter layer; and
     an upper layer portion that includes a transparent layer,
    the lower layer portion is on an incident side of the plurality of optical elements,
    the upper layer portion is on an emanating side of the plurality of optical elements,
    the color filter layer includes a concave curved surface at an interface between the upper layer portion and the lower layer portion, and
    the plurality of optical elements exposes the upper layer portion and at least a part of the lower layer portion to interface with an outside of the light emitting device.

\* \* \* \* \*